(12) United States Patent
Naskar et al.

(10) Patent No.: US 12,176,408 B2
(45) Date of Patent: Dec. 24, 2024

(54) LOCALIZED SPACER FOR NANOWIRE TRANSISTORS AND METHODS OF FABRICATION

(71) Applicant: Intel Corporation, Santa Clara, CA (US)

(72) Inventors: Sudipto Naskar, Portland, OR (US); Willy Rachmady, Beaverton, OR (US); Hsin-Fen Li, Hillsboro, OR (US); Christopher Parker, Portland, OR (US); Prashant Wadhwa, Portland, OR (US); Tahir Ghani, Portland, OR (US); Mohammad Hasan, Aloha, OR (US); Jianqiang Lin, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 775 days.

(21) Appl. No.: 17/131,467

(22) Filed: Dec. 22, 2020

(65) Prior Publication Data
US 2022/0199797 A1 Jun. 23, 2022

(51) Int. Cl.
*H01L 29/423* (2006.01)
*B82Y 10/00* (2011.01)
(Continued)

(52) U.S. Cl.
CPC ...... *H01L 29/42392* (2013.01); *H01L 27/088* (2013.01); *H01L 29/41733* (2013.01); *H01L 29/78696* (2013.01)

(58) Field of Classification Search
CPC ........... H01L 29/66553; H01L 29/6656; H01L 29/42364; H01L 29/42392; H01L 29/78696; H01L 21/823814; H01L 21/823842; H01L 29/6653; H01L 21/823468; H01L 21/823864
See application file for complete search history.

(56) References Cited

U.S. PATENT DOCUMENTS 9,947,804 B1 4/2018 Frougier et al.
2015/0084041 A1 3/2015 Hur et al.
(Continued)

OTHER PUBLICATIONS

Extended European Search Report from European Patent Application No. 21208881.9 notified Apr. 21, 2022, 11 pgs.

*Primary Examiner* — Sonya McCall-Shepard
(74) *Attorney, Agent, or Firm* — Essential Patents Group, LLP

(57) ABSTRACT

A transistor includes a first channel layer over a second channel layer, an epitaxial source structure coupled to a first end of the first and second channel layers and an epitaxial drain structure coupled to a second end of the first and second channel layers. The transistor includes a gate between the epitaxial source structure and the epitaxial drain structure, where the gate is above the first channel layer and between the first channel layer and the second channel layer. The transistor includes a first spacer of a first material, between the first and second channel layers includes. The first spacer has at least one convex sidewall that is between the gate and the epitaxial source structure and between the gate and the epitaxial drain structure. The transistor also includes a second spacer of a second material having substantially vertical sidewalls above the first channel layer.

15 Claims, 17 Drawing Sheets

(51) Int. Cl.
  *H01L 27/088*    (2006.01)
  *H01L 29/06*     (2006.01)
  *H01L 29/08*     (2006.01)
  *H01L 29/165*    (2006.01)
  *H01L 29/417*    (2006.01)
  *H01L 29/66*     (2006.01)
  *H01L 29/775*    (2006.01)
  *H01L 29/78*     (2006.01)
  *H01L 29/786*    (2006.01)
  *H10B 61/00*     (2023.01)
  *H10B 63/00*     (2023.01)

(56) References Cited

U.S. PATENT DOCUMENTS

| | | |
|---|---|---|
| 2017/0222006 A1 | 8/2017 | Suh et al. |
| 2018/0166558 A1 | 6/2018 | Wostyn et al. |
| 2018/0175035 A1 | 6/2018 | Yang et al. |
| 2019/0148515 A1 | 5/2019 | Cheng et al. |
| 2020/0127048 A1* | 4/2020 | Kim .................. H01L 21/76885 |
| 2020/0365692 A1 | 11/2020 | Jung et al. |
| 2021/0083074 A1* | 3/2021 | Yang .................. H01L 29/0673 |

\* cited by examiner

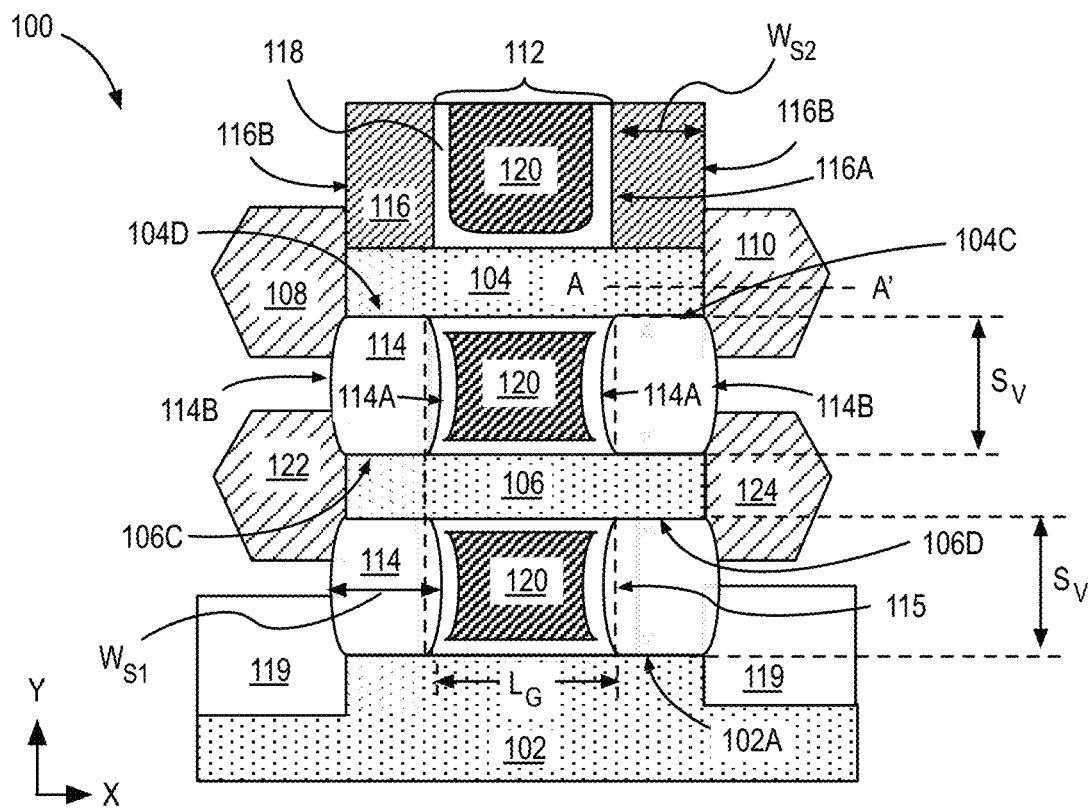
FIG. 1A
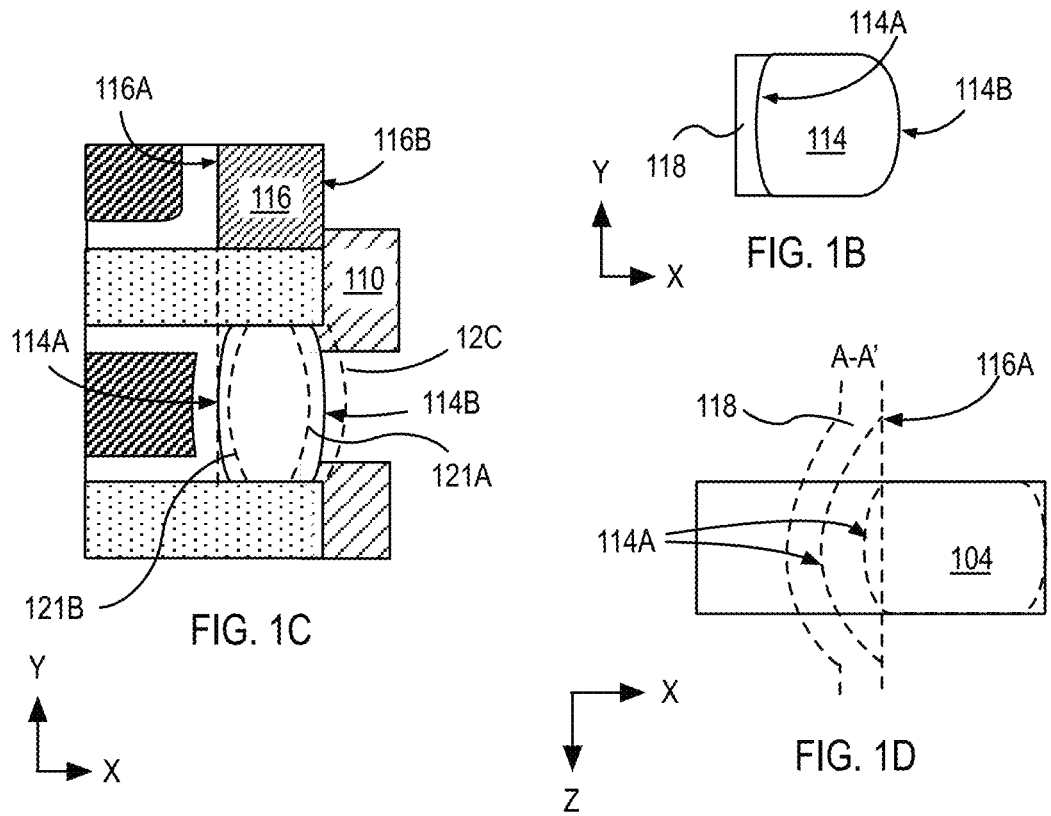
FIG. 1C
FIG. 1B
FIG. 1D

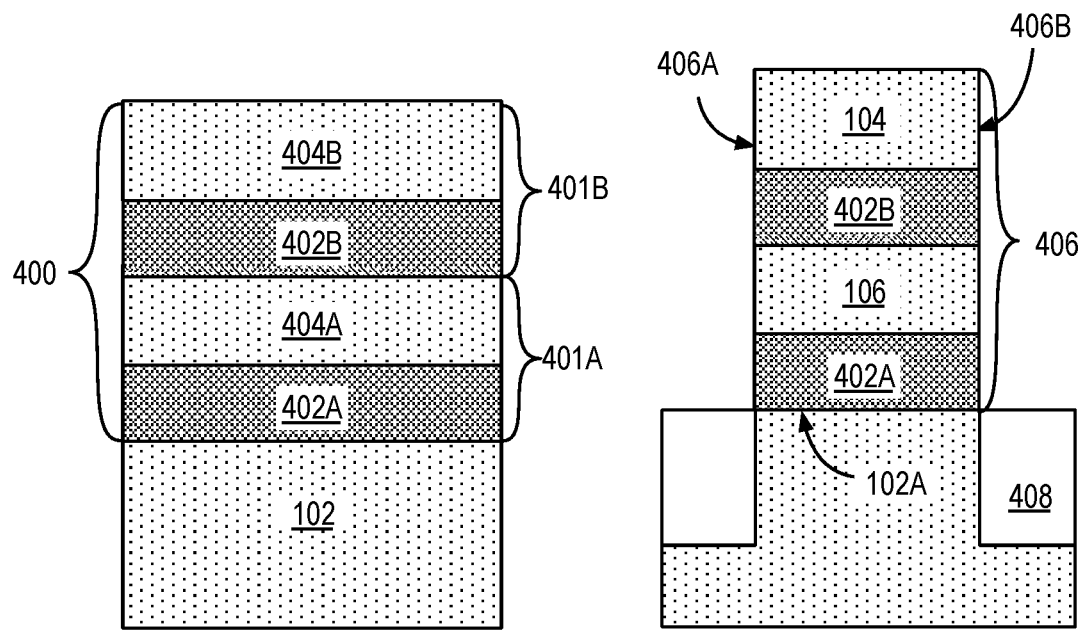
FIG. 4A
FIG. 4B
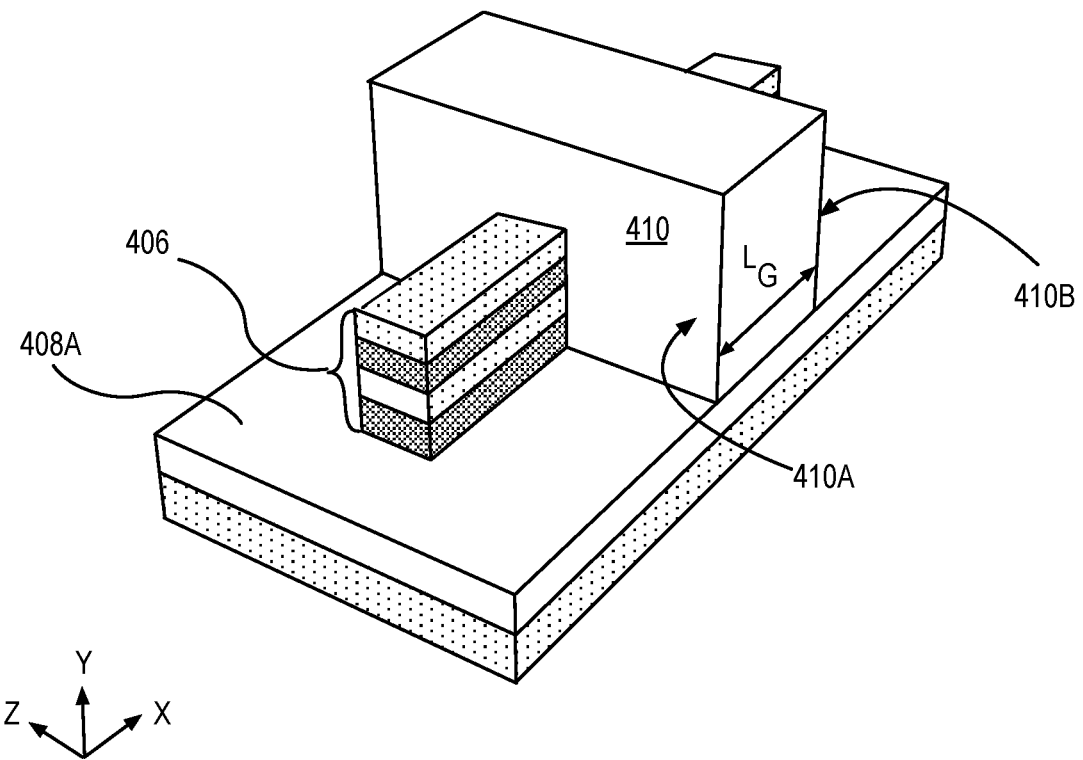
FIG. 4C

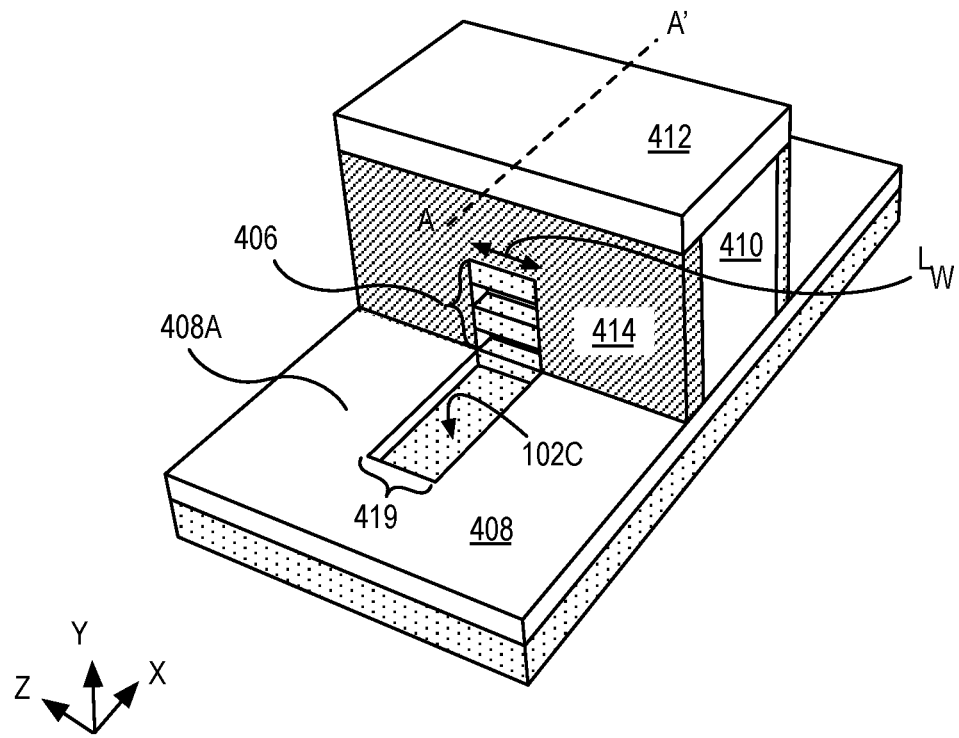
FIG. 6A
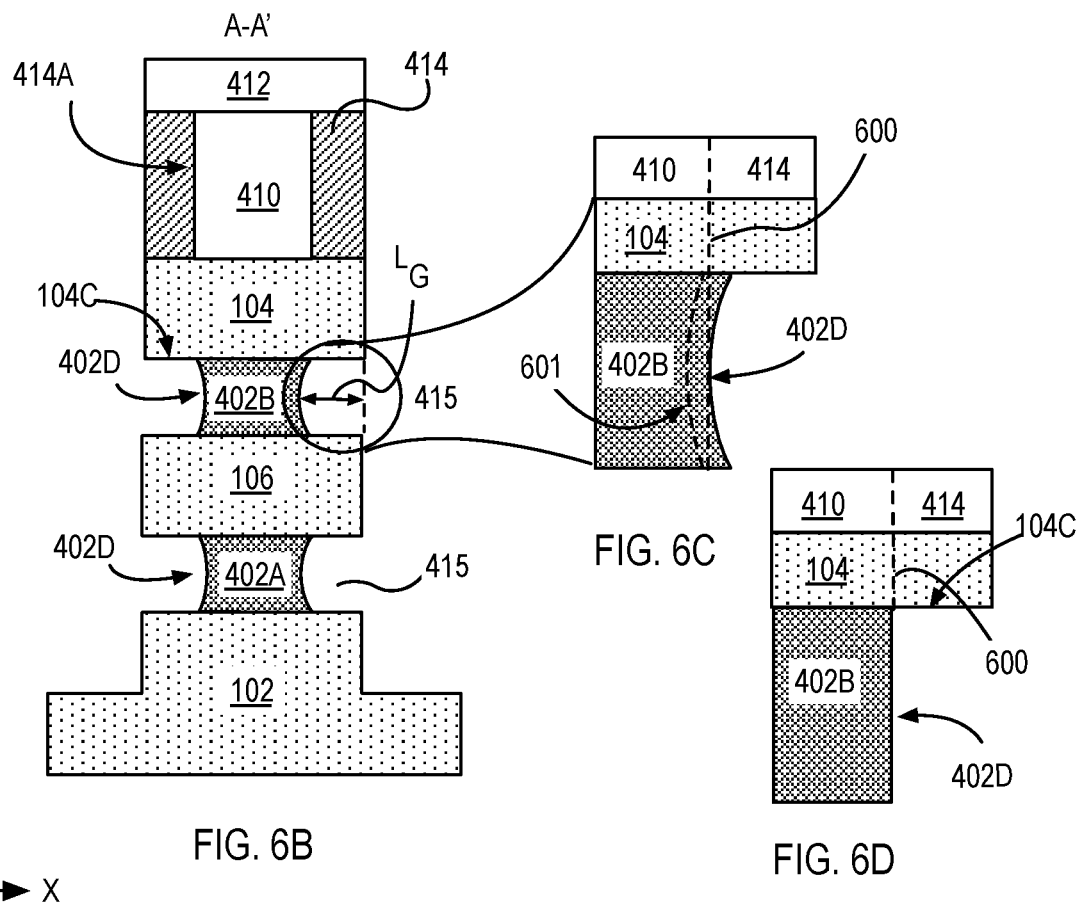
FIG. 6B
FIG. 6C
FIG. 6D

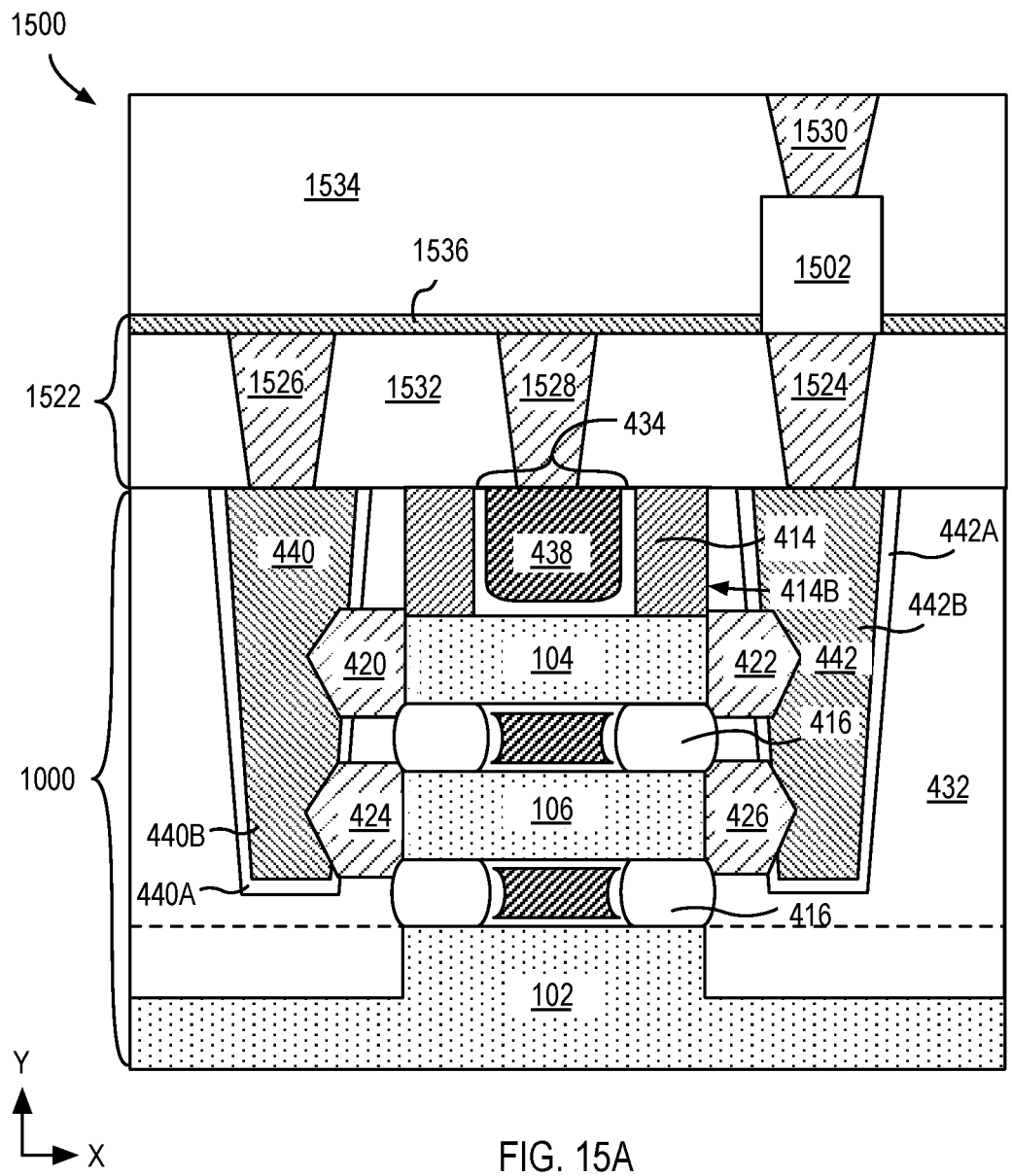
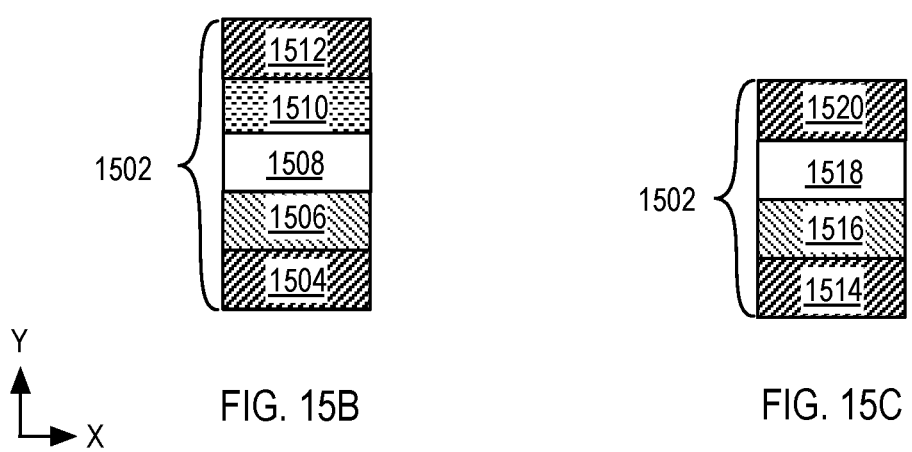
FIG. 15A
FIG. 15B
FIG. 15C

LOCALIZED SPACER FOR NANOWIRE TRANSISTORS AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. Scaling of such transistors which include silicon channels becomes more challenging when device metrics such as off state leakage, subthreshold slope or gate control for example, become adversely affected. Silicon nanowire-based transistor offers a pathway to scale dimensions of silicon-based transistors while improving gate control and mitigating issues such as off-state leakage current. While pitch scaling can increase transistor density, spacing between transistors can impede integration of dielectric spacers between nanowire channels. Dielectric spacers are essential to prevent shorting between gate and source or drain. As such, development is needed in areas of spacer formation in nanowire transistors.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1A is a cross-sectional illustration of a transistor including a plurality of nanowires formed above a substrate, in accordance with an embodiment of the present disclosure.

FIG. 1B is a cross-sectional illustration of a spacer having opposing surfaces that have different magnitudes of curvature.

FIG. 1C is an enhanced cross-sectional illustration of an embodiment of a portion of the structure of FIG. 1A.

FIG. 1D is a plan-view illustration of a portion of a spacer in FIG. 1A.

FIG. 4A is a cross-sectional illustration of material layer stack for fabrication of a nanowire transistor device, where the material layer stack includes a plurality of bilayers, where each of the bilayer includes a sacrificial layer on a layer of monocrystalline silicon, in accordance with an embodiment of the present disclosure.

FIG. 4B is a cross sectional illustration of a block formed by patterning the material layer stack.

FIG. 4C is an isometric illustration following the formation of a dummy gate structure formed on a first portion of the block.

FIG. 6A illustrates the structure of FIG. 4E following the process to remove the sacrificial layer adjacent to the layer of monocrystalline silicon in the plurality of bilayers.

FIG. 6B is a cross-sectional illustration of a portion of the structure of FIG. 6A, along a line A-A'.

FIG. 6C is an enhanced cross-sectional illustration of a portion of the structure of FIG. 6B, illustrating effect of etch on sidewall surfaces.

FIG. 6D is an enhanced cross-sectional illustration of a portion of the structure of FIG. 6B, illustrating vertical sidewall surfaces.

FIG. 15A is a cross-sectional illustration of a memory device coupled with a transistor including a plurality of recessed nanowires, in accordance with an embodiment of the present disclosure.

FIG. 15B is a cross-sectional illustration of a magnetic tunnel junction device, in accordance with an embodiment of the present disclosure.

FIG. 15C is a cross-sectional illustration of a resistive random-access memory device, in accordance with an embodiment of the present disclosure.

DESCRIPTION OF THE EMBODIMENTS

Figure 1E:
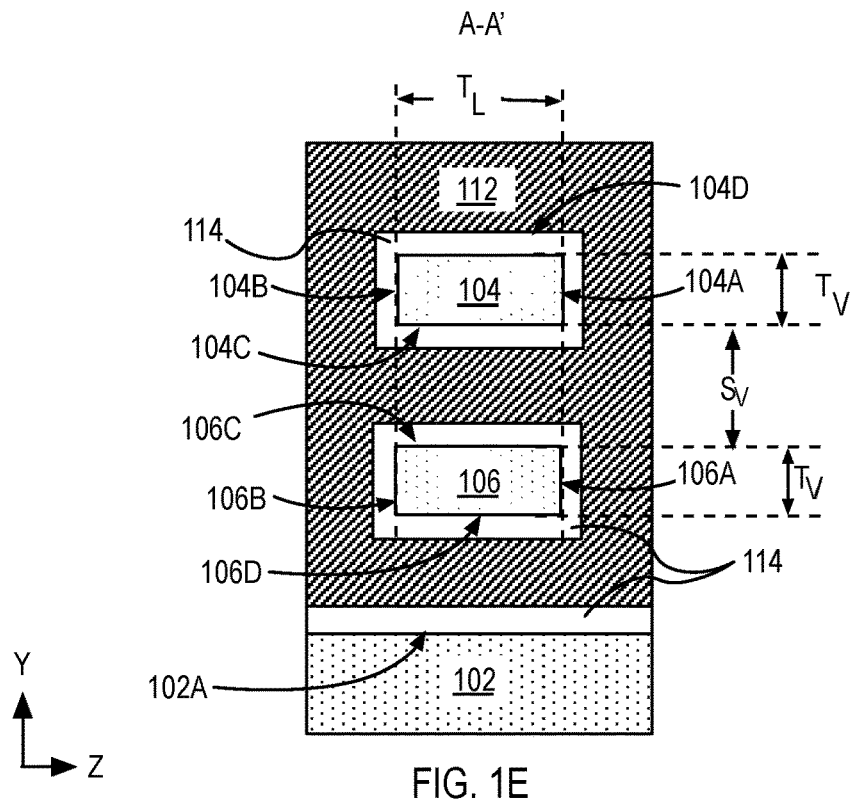
FIG. 1E is a cross-sectional illustration of the structure in FIG. 1A taken along a line A-A'.

Localized spacers for nanowire transistors and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with a nanowire transistor, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

To enable scaling in silicon channels, transistor architecture such as nanowire and stacked nanowires have been adopted. Nanowire transistors provide benefits such as near ideal sub-threshold slopes, low leakage current and less degradation of mobility with gate voltage compared to other transistor architectures. Nanowire transistors have been integrated with dielectric spacer materials similar to various other transistor architectures. Such spacers provide electrical insulation between a gate and a source or drain of a nanowire transistor and often include low-k dielectric film to minimize parasitic capacitance. Typically, such dielectric spacers are deposited by a physical vapor deposition or an atomic layer deposition process. However, with feature-size scaling, spacing between nanowire channels, and between individual transistors has shrunk to levels that are comparable to a thickness of dielectric spacer.

Spacer deposition in nanowire configurations is further complicated when a first spacer, above an uppermost nanowire in a plurality of nanowires, is fabricated prior to a second spacer that is deposited between individual nanowires. A feature of the first spacer formation is that during fabrication, the first spacer is self-aligned to transistor gates without any need for an additional mask during patterning, with the caveat that the first spacer is not pinched off during deposition.

Hence, when two adjacent transistors are formed the first spacer of each transistor determines a space between the two transistors for deposition of a second spacer. The space between the two adjacent transistors is a space between two outer sidewalls of the first spacer. If this space is less than two times a thickness of the first spacer, then this leaves no room for deposition of the second spacer because of pinch-off effects.

In various examples, the spacing between adjacent transistors can be less than 25 nm and between nanowire channels can be between 5 nm to 10 nm. As such there is not enough space to deposit even a relatively thin (less than 15 nm thick) second spacer film between adjacent transistors and between nanowire channels without pinching off. Thus, with traditional methods, the first spacer material and formation technique may dictate a minimum spacing, for example, between transistor gates or nanowire channels.

However, the inventors have found a method to selectively deposit or grow the second spacer of low-k dielectric material adjacent to certain surfaces of materials including metallic properties. In exemplary embodiments, the second spacer may be formed adjacent to materials that include silicon and germanium, selectively to silicon or other dielectric materials. The growth process can be controlled to provide a certain desired thickness enabling integration of low-k dielectric spacers in tight spaces. Thus, instead of depositing and etching, the second spacer is nucleated from surfaces between the nanowires. In one embodiment, the spacer can nucleate from a surface of a sacrificial material between adjacent nanowires after a partial removal of the sacrificial material. In a second embodiment, the spacer can nucleate from an epitaxially formed source or drain material formed adjacent to nanowires, after complete removal of a sacrificial material between adjacent nanowires.

Such a growth technique has an added advantage in that sufficiently large epitaxial source and drain structures may be formed in PMOS nanowire transistors prior to formation of second spacer. Sufficiently large epitaxial blocks may increase uniaxial compressive strain in PMOS nanowire transistors, where space limitations have limited size of epitaxial source and drain structures. Increased uniaxial compressive strain may further advantageously increase drive current in PMOS nanowire transistors.

FIG. 1A is a cross-sectional illustration of a transistor 100 above a substrate 102. In an embodiment, the transistor 100 is a nanowire transistor 100. The transistor 100 includes a channel layer 104 over a channel layer 106, where the channel layer 104 and channel layer 106 include monocrystalline silicon. The transistor further includes epitaxial source structure 108 coupled to a first end of the channel layer 104 and channel layer 106, and an epitaxial drain structure 110 coupled to a second end of the channel layer 104 and channel layer 106, as shown. A gate 112 is between the epitaxial source structure 108 and the epitaxial drain structure 110, above channel layer 104 and between the channel layers 104 and 106. The transistor 100 further includes a dielectric spacer 114 including a first material and at least one convex sidewall. The spacer 114 is between the gate 112 and the epitaxial source structure 108 and between the gate 112 and the epitaxial drain structure 110. The spacer 114 is between channel layers 104 and 106. The transistor further includes a spacer 116, including a second material adjacent to the gate 112. The spacer 116 is between the gate 112 and the epitaxial source structure 108 and between the gate 112 and the epitaxial drain structure 110. In the cross-sectional illustration, the spacer 116 is above the channel layer 104.

In the illustrative embodiment, the gate 112 further includes a gate dielectric layer 118 and a gate electrode 120 adjacent to the gate dielectric layer 118. In an embodiment, the spacer 114 includes silicon, oxygen and carbon. The ratio of carbon to oxygen may depend on a number of desired transistor parameters and on composition of sacrificial materials utilized during the fabrication process, as will be discussed below. In embodiments, the ratio of carbon to oxygen in the spacer 114 varies between (1:3 to 10:1). The spacer 114 may have a uniform carbon content throughout a volume of the spacer.

In an embodiment, spacer 116 includes silicon, carbon, oxygen and nitrogen. In some such embodiments, an atomic percent of carbon is between 3-5 percent, an atomic percent of oxygen is between 25-35 (25-40) percent, and an atomic percent of nitrogen is between 14-18 (10-20) percent and the balance is silicon. In other embodiments, spacer 114 and spacer 116 include a same material or substantially same material. In some such embodiments, spacer 114 and spacer 116 include silicon, oxygen and carbon. In other embodiments, spacer 114 and spacer 116 include silicon, oxygen and carbon where a ratio of O:C in spacer 114 is greater than a ratio of O:C in spacer 116.

In some embodiments spacer 114 has at least one sidewall that is convex. In some such embodiments, an outer sidewall such as sidewall 114B is convex. In further such embodiments, an inner sidewall 114A is substantially vertical as indicated by dashed line 115. Differences in sidewall profiles are indicative of a processing operations utilized to form spacer 114, as described below.

However, in other embodiments, such as is shown, the spacer 114 has convex sidewall 114A and convex sidewall 114B, opposite to convex sidewall 114A. As shown, convex sidewall 114A is adjacent to the gate dielectric layer 118. Convex sidewalls 114A and 114B extend between upper surface 104D and lower surface 104C of channel layer 104, and channel layer 106, respectively. Convex sidewall 114B is adjacent to portions of the epitaxial source structure 108 one side of transistor 100 and convex sidewall 114B is also adjacent to epitaxial drain structure 110 on an opposite side of transistor 100, as shown. The sidewalls 114A and 114B have shapes that are indicative of processing operations utilized to form spacer 114, as described below.

The sidewalls 114A and 114B may not have similar curvatures. In embodiments, convex sidewall 114A is more or less curved that convex sidewall 114B. As shown in FIG. 1B, in an exemplary embodiment, sidewall convex sidewall 114B is substantially more curved that convex sidewall 114A.

In an embodiment, spacer sidewall 114B extends laterally beyond a sidewall 116B of spacer 116 and also laterally beyond channel layers 104 and 106. In an embodiment, spacer sidewall 114A extends under a portion of the gate 112. In some such embodiments, the spacer sidewall 114A extends laterally beyond sidewall 116A. Depending on embodiments, the spacer 114 has a lateral thickness, $W_{S1}$, and a vertical thickness, $T_V$. In an embodiment, $W_{S1}$ is between 4 nm and 12 nm. $T_V$ may be between 5 nm and 15 nm. Spacer 116 has a lateral thickness, $W_{S2}$. In the illustrative embodiment, $W_{S2}$ is less than $W_{S1}$.

FIG. 1C is an enhanced cross-sectional illustration of an embodiment of a portion of the structure of FIG. 1A. In the illustrative embodiment, the sidewall 114A of spacer 114 is substantially aligned with sidewall 116A of spacer 116, and outer sidewall 114B is substantially aligned with sidewall 116B. In the illustrative embodiment, $W_{S2}$ is substantially the same as $W_{S1}$. However, in some embodiments, the sidewall 114B may be within channel layers 104 and 106 as indicated by dashed line 121A. $W_{S2}$ may be equal to or greater than $W_{S1}$. In other embodiments sidewall 114B extends beyond sidewall 116B (indicated by dashed line 121C).

In other embodiments, the sidewall 114A extends beyond sidewall 116A as shown in the plan view illustration of FIG. 1D. An outline of the channel layers 104 is shown. Outlines of the spacer sidewall 114A are superimposed to provide context. In one embodiment, sidewall 114A laterally extends beyond sidewall 116A. In another embodiment, the spacer 114 also extends beyond channel layers 104 and 106 and onto portions of spacer sidewall 116A (in z-direction), as shown. In some such embodiments, the gate dielectric layer 118 is conformal with the convex sidewall 114A, as shown.

Referring again to FIG. 1A, two channel layers 104 and 116 are shown. Channel layers 104 and 106 may be nanowire channels. FIG. 1E is a cross sectional illustration through a midplane of the transistor 100, in accordance with an embodiment of the present disclosure.

As shown, channel layer 104 and channel layer 106 each have a vertical thickness, $T_V$, along a first direction (Y-axis) that is orthogonal to a length (along X-axis). As shown, channel layer 104 and channel layer 106 each have a lateral thickness, $T_L$, along a second direction (Z-axis). In an embodiment, $T_V$ is between 5 nm and 10 nm and wherein the $T_L$ is between 5 nm and 50 nm. In an embodiment, the cross-sectional area of channel layers 104 and 106, as shown in the Figure, is at least 30 nm$^2$. In some embodiments, the channel layer 104 has a lateral thickness, $T_L$, that is less than a lateral thickness, $T_L$, of the channel layer 106. In embodiments, the difference in lateral thicknesses is less than 10%. In some embodiments, the channel layer 104 has a vertical thickness, $T_V$, that is less than a vertical thickness, $T_V$, of the channel layer 106. In embodiments, the difference in vertical thicknesses is less than 10%. In other embodiments channel layer 104 and channel layer 106 have a substantially rectangular profile. As shown in the cross-sectional illustration, channel layer 104 has a sidewall 104A and a sidewall 104B opposite to sidewall 104A, and channel layer 106 has an uppermost surface 106C and a lowermost surface 106D opposite to uppermost surface 106C.

As shown, channel layer 104 has a lowermost surface 104C that is spaced apart from an uppermost surface 106C of the channel layer 106 by a distance, $S_V$. Also as shown, channel layer 106 has a lowermost surface 106D that is spaced apart from an uppermost surface 102A of the substrate 102, by a distance, $S_V$. In embodiments, $S_V$ ranges between 3 nm and 15 nm and is sufficiently thick to a combined thickness of the gate dielectric layer 118 adjacent to surfaces 104C and 106C and a gate electrode 120 in between the gate dielectric layer 118, as shown in the Figure. $S_V$ also determines a maximum thickness of spacer 114. It is to be appreciated that $S_V$ is also a vertical thickness of the spacer 114.

In the illustrative embodiment, gate dielectric layer 118 surrounds channel layer 104 and channel layer 106. As shown, gate dielectric layer 118 is also directly adjacent to sidewalls 104A and 104B of channel layer 104 and directly adjacent to sidewalls 106A and 106B of channel layer 106. In some embodiments, gate dielectric layer 118 has a uniform thickness on sidewalls 104A and 104B and on sidewalls 106A and 106B. In some embodiments, thickness of gate dielectric layer 118 on surface 104C may be different than a thickness of the gate dielectric layer 118 on surface 104D, and that a thickness of the gate dielectric layer 118 on uppermost surface 106C may be different than a thickness of the gate dielectric layer 118 on lowermost surface 106D. In embodiments, the difference in thickness is less than 10%. Differences in thickness of less than 10% does not appreciably affect features of spacer 114.

In embodiments, the gate dielectric layer 118 is an insulator having a high dielectric constant (such as a dielectric constant above 4). In embodiments gate dielectric layer 118 includes elements such as hafnium, silicon, oxygen, titanium, tantalum, lanthanum, aluminum, zirconium, barium, strontium, yttrium, lead, scandium, niobium, and zinc. Examples of high dielectric constant materials that may be used in the gate dielectric layer 118 include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

In other embodiments, channel layers 104 and 106 have surfaces that do not intersect at right angles. In some embodiments, channel layer 104 and channel layer 106 each have a cross sectional profile, orthogonal to an axis of the channel layers 104 and 106, where upper and lower surfaces 104D and 104C, respectively that are substantially planar and sidewalls 104A and 104B that are rounded (not shown).

As shown in FIGS. 1E, the gate electrode 120 surrounds each of channel layer 104 and channel layer 106. Depending on the thickness of the gate dielectric layer 118, the gate electrode has a vertical thickness (for example relative to surface 106C) between 3 nm and 10 nm in the space between the channel layer 104 and channel layer 106.

In embodiments, the gate electrode 120 includes one or more layers, where a first layer, in contact with the gate dielectric layer 118, is a work function electrode and a second layer in contact with the first layer is a fill metal. Depending on $S_T$, some gate electrode portions such as gate electrode portion between channel layers 104 and 106 and gate electrode portion below channel layer 106 and above surface 102A may only include a work function electrode. Portions of gate electrode 120 adjacent to spacer 116 may include a work function electrode and a fill metal. In some embodiments, the work function layer includes one or more of hafnium, zirconium, titanium, tantalum, aluminum, or carbon, or carbon and one or more of hafnium, zirconium, titanium, tantalum, aluminum. In some embodiments, the fill metal may include tantalum or tungsten.

Referring again to FIG. 1A, portions of epitaxial source structure 108 and epitaxial drain structure 110 adjacent to channel layer 104 extend over sidewalls 116A and 114B of spacers 116 and 114 respectively. As shown, epitaxial source structure 108 and epitaxial drain structure 110 is not contiguous with epitaxial source structure 122 and epitaxial drain structure 124 adjacent to channel layer 106. In an exemplary embodiment, the epitaxial source structure 108, epitaxial drain structure 110, epitaxial source structure 122 and the epitaxial drain structure 124 include a same material. In an embodiment, the epitaxial source structure 108, epitaxial drain structure 110, epitaxial source structure 122 and the epitaxial drain structure 124 include Si. In an embodiment, epitaxial source structure 108, epitaxial drain structure 110, epitaxial source structure 122 and the epitaxial drain structure 124 each include a doped semiconductor material. In embodiments epitaxial source structure 108, epitaxial drain structure 110, epitaxial source structure 122 and the epitaxial drain structure 124 include epitaxial Si that is doped with arsenic or phosphorus. A phosphorus doped silicon epitaxial source structure 108, epitaxial drain structure 110, epitaxial source structure 122 or epitaxial drain structure 124 is utilized for a N-MOS transistor 100. In some such embodiments, epitaxial source structure 108, epitaxial drain structure 110, epitaxial source structure 122 or epitaxial drain structure 124 include silicon and carbon.

In the illustrative embodiment, the epitaxial source structure 122 and the epitaxial drain structure 124 are separated from the substrate 102 by a dielectric 119. In an embodiment, the dielectric 119 includes silicon and at least one of oxygen, nitrogen and/or carbon. In an exemplary embodiment, dielectric 119 includes silicon, oxygen and carbon or silicon and carbon. In an embodiment, the epitaxial source structure 122 and epitaxial drain structure 124 each include a doped with an impurity such as phosphorus, boron or arsenic.

In an embodiment, the substrate 102 includes single crystal silicon. In some embodiments, the substrate 102 is a silicon on insulator stack, where substrate 102 includes a layer of silicon on a layer of silicon dioxide above a layer of silicon. The substrate 102 may or may not be doped.

While two channels, such as channel layer 104 and channel layer 106 are shown, in other examples, transistor 100 can include up to 5 channels. A larger number of channels can increase a drive current of transistor 100. Other factors that increase drive current in transistors, (in PMOS transistor for example) is to increase uniaxial strain through structural modifications in epitaxial source structure 108 and epitaxial drain structure 110.

Figure 1F:
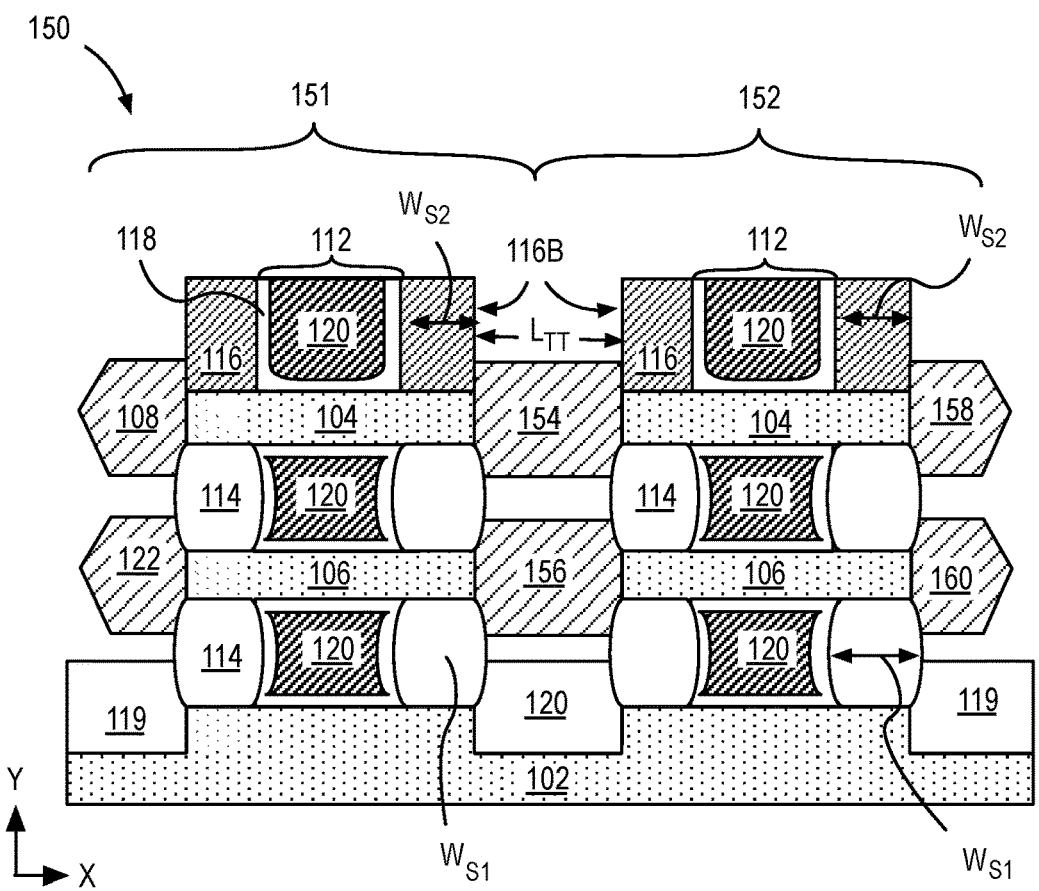
FIG. 1F is a cross-sectional illustration of a pair of transistors.

FIG. 1F is a cross-sectional illustration of a transistor array 150 that includes transistor 151 and a substantially identical transistor 152. In exemplary embodiments, transistors 151 and 152 include one or more features of the transistor 100, such as channel layers 104, 106, gate electrode 120, gate dielectric layer 118 etc. As shown, transistor 151 is laterally separated from transistor 152. For example, the respective spacer sidewalls 116B of each transistor 151 and 152 are separated by a distance $L_{TT}$. In some embodiments, $L_{TT}$ is less than two times a lateral thickness, $W_{S1}$ of spacer 114 but greater than $W_{S1}$.

In exemplary embodiments, an epitaxial drain structure of transistor 151 is merged with an epitaxial drain structure of transistor 152. As shown, an epitaxial structure 154 is directly adjacent to and between channel layers 104 of each transistor 151 and 152, and an epitaxial structure 156 is directly adjacent to and between channel layers 106 of each transistor 151 and 152. Epitaxial structures 154 and 156 are epitaxial drain structures for transistor 151 and 152. As shown, transistor 152 has epitaxial source structures 158 and 160 on opposite sides of epitaxial structure 154 and 156. In an exemplary embodiment, the epitaxial structures 154 and 156, epitaxial source structures 108, 122, 158 and 160 each include silicon and carbon.

In some embodiments such as is shown, epitaxial structures 154 and 156 are distinct, but are coupled by a single shared contact electrode that extends between them (not shown).

In some examples, the epitaxial source structure 108 and epitaxial drain structure 110 are not discrete structures adjacent to each channel layer, but extend between multiple channel layers. The advantage of such epitaxial source or drain structures is that they may provide enhanced strain to a transistor through an increased volume. In some such examples, spacer 114 may include shapes that are influenced by the material of the epitaxial source or drain structures, as described herein.

Figure 2A:
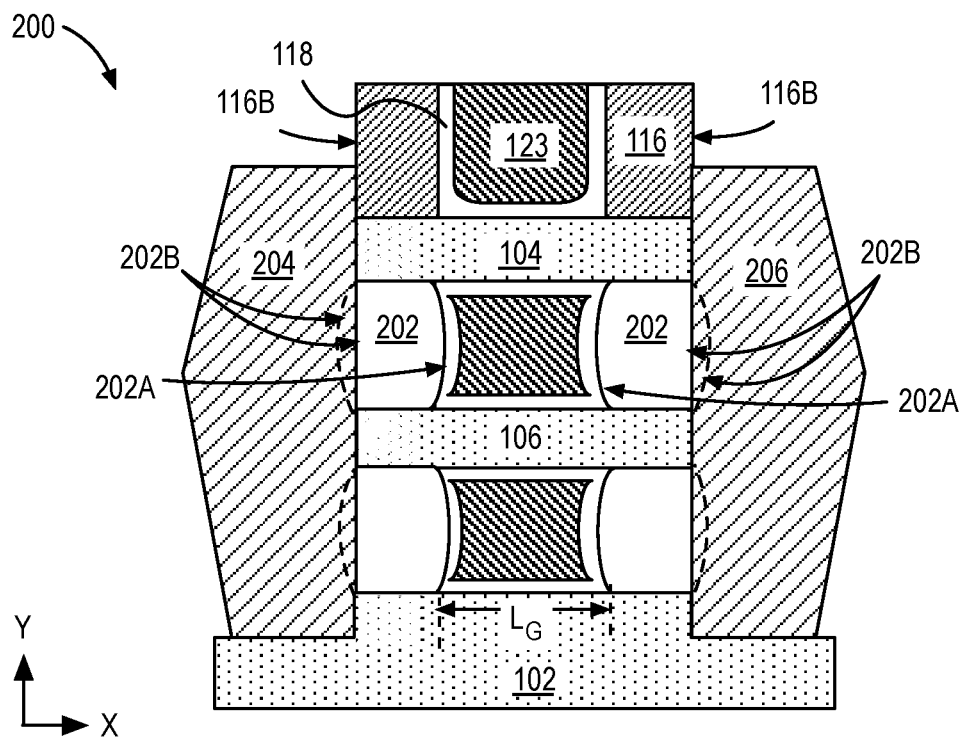
FIG. 2A is a cross-sectional illustration of a transistor including a plurality of nanowires, in accordance with an embodiment of the present disclosure.

FIG. 2A is a cross-sectional illustration of a transistor 200 in accordance with an embodiment of the present disclosure. As shown transistor 200 includes features of transistor 100, such as channel layers 104 and 106, gate dielectric layer 118, and gate electrode 123. Transistor 200 further includes spacer 202, epitaxial source structure 204 and epitaxial drain structure 206.

Spacer 202 has one or more features of the spacer 114 described in association with FIG. 1A. Spacer 202 includes a material that is the same or substantially the same as the material of the spacer 114. As shown, spacer sidewall 202A is adjacent to gate dielectric layer 118 and sidewall 202B is adjacent epitaxial drain structure 206 and epitaxial source structure 204. In the illustrative embodiment, sidewall 202A is a convex sidewall, and gate dielectric layer 118 is substantially conformal with convex sidewall 202A. The convex sidewall 202A is indicative of a process utilized to fabricate spacer 202.

In the illustrative embodiment, sidewall 202B is substantially vertical and matches a sidewall profile of the epitaxial source structure 108 or epitaxial drain structure 110. In other embodiments, sidewall 202B has a convex shape (indicated by the dashed lines). In some such embodiments, convex sidewall 202B (indicated by dashed lines) is within a body of the epitaxial source structure 204 or epitaxial drain structure 206. When spacer 202 is confined laterally (along the X direction) under the channel layer 104, sidewall 202B may not necessarily have a convex shape. It is to be appreciated that while sidewalls 202A and 202B may both be convex, sidewall 202A may be substantially more curved than sidewall 202B.

In the illustrative embodiment, the epitaxial source structure 204 extends continuously from channel layer 104 to channel layer 106, and the epitaxial drain structure 206 extends continuously from channel layer 104 to channel layer 106. As shown, portions of epitaxial source structure 204 and epitaxial drain structure 206 are laterally adjacent to a portion of sidewall 116B of the spacer 116. However, as shown, epitaxial source structure 204 and epitaxial drain structure 206 are laterally adjacent to an entire surface of sidewall 202B. As shown, the epitaxial source structure 204 and epitaxial drain structure 206 have a larger volume compared to volumes of epitaxial source structure 108 and epitaxial drain structure 110 illustrated in FIG. 1A. Referring again to FIG. 2A, increased volumes of epitaxial source structure 204 and epitaxial drain structure 206 may impart a larger uniaxial strain to the channel layers 104 and 106 compared to a smaller volume of epitaxial source structure 108 and epitaxial drain structure 110. In an embodiment, epitaxial source structure 204 and epitaxial drain structure 206 include Si and Ge. In some such embodiments, epitaxial source structure 204 and epitaxial drain structure 206 that include Si and Ge, further include dopants such as boron, gallium, indium or aluminum. In the illustrative embodiment, epitaxial source structure 204 and epitaxial drain structure 206 are adjacent to substrate 102. In other embodiments, epitaxial source structure 204 and epitaxial drain structure 206 include Si and dopants such as phosphorus and arsenic.

In embodiments, the gate electrode 123 includes one or more layers, where a first layer, in contact with the gate dielectric layer 118, is a work function electrode and a second layer in contact with the first layer is a fill metal. In some embodiments, the work function layer in contact with the gate dielectric layer 118 includes an elemental layer, a metal alloy layer or a laminate structure of either or both. In some embodiments, the work function layer includes one or more of ruthenium, palladium, platinum, cobalt, nickel or titanium nitride. In some embodiments, the fill metal may include tantalum or tungsten.

Figure 2B:
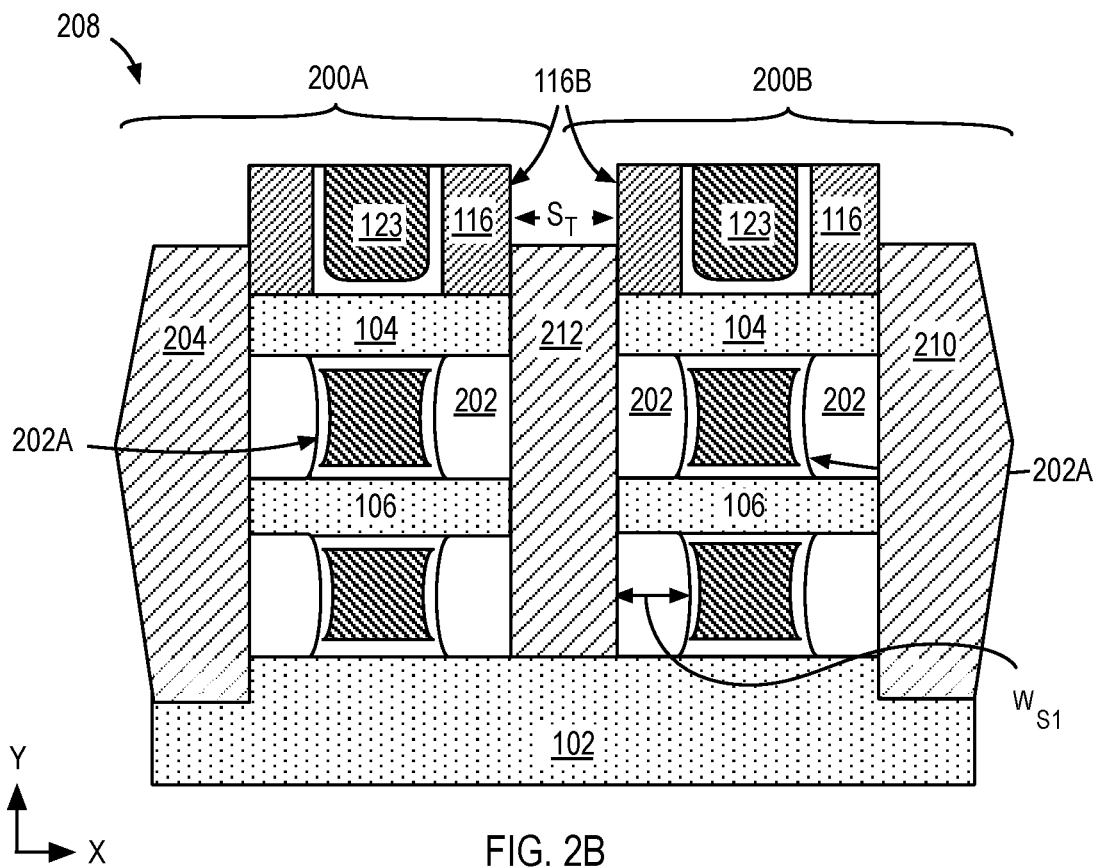
FIG. 2B is a cross-sectional illustration of a pair of transistors.

FIG. 2B is a cross-sectional illustration of a transistor array 208 that includes a transistor 200A adjacent to a transistor 200B. In an embodiment, transistors 200A and 200B are substantially identical and include features of the transistor 200. Transistor array 208 includes a shared epitaxial structure 212. In the illustrative embodiment, epitaxial structure 212 is an epitaxial drain structure 212 for transistor 200A and for transistor 200B. Transistor 200B further includes an epitaxial source structure 210 coupled with the channel layers 104 and 106, opposite to epitaxial drain structure 212. In exemplary embodiments, epitaxial source structures 204 and 210, and epitaxial drain structures 210 include silicon and germanium.

As shown, the epitaxial structure 212 has a lateral thickness that is determined by spacing, $S_T$, between spacer sidewall 116B of transistor 200A and spacer sidewall 116B of transistor 200B. In embodiments, $S_T$ is between 10 nm and 25 nm. In embodiments, $S_T$ is equal to a lateral thickness, $W_{S1}$, of spacer 116, where the lateral thickness, $W_{S1}$, is defined along a length of channel layer 104 or 106. In other embodiments, $S_T$ is equal to one and half times $W_{S1}$.

Figure 3:
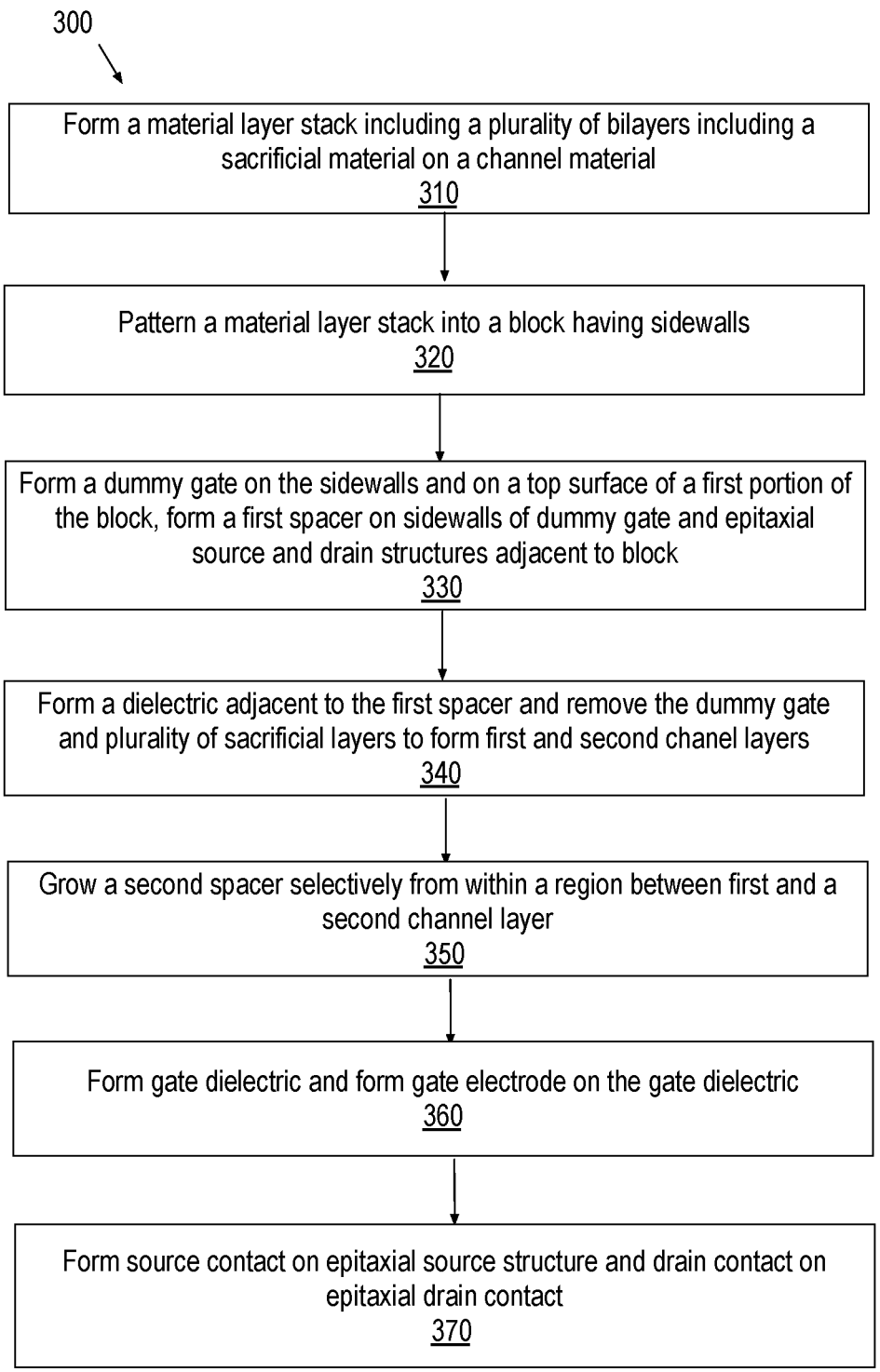
FIG. 3 is a method to fabricate a nanowire transistor such as illustrated in FIG. 1A, in accordance with an embodiment of the present disclosure.

FIG. 3 is a method 300 to fabricate a transistor such as transistor 100 in accordance with an embodiment of the present disclosure. The method 300 begins at operation 310 with the formation of a material layer stack including a plurality of bilayers of a layer of a sacrificial material on a layer of monocrystalline silicon. The method 300 continues at operation 320 with patterning of the material layer stack into a block. The method 300 continues at operation 330 with the formation of a dummy gate on a first portion of the block and on sidewalls of the block and formation of a first spacer on sidewalls of dummy gate and removing portions of the block external to the first spacer and form epitaxial source and drain structures adjacent to block. The method 300 continues at operation 340 with formation of a dielectric adjacent to the spacer and removal of the layer of sacrificial material between each layer of monocrystalline silicon from the plurality of bilayers to form first and second channel layers. The method 300 continues at operation 350 with the formation of a second spacer between first and second channel layer. The method 300 continues at operation 360 with formation of a gate structure between the spacer after removing remaining portions of sacrificial material from each layer of sacrificial material in the block. The method concludes at operation 370 with the formation of source and drain contacts on epitaxial source and epitaxial drain structures, respectively.

FIG. 4A is a cross-sectional illustration of material layer stack 400 for fabrication of a nanowire transistor device, in accordance with an embodiment of the present disclosure.

In an embodiment, a material layer stack 400 having a plurality of bilayers is formed on the substrate 102. In the illustrative embodiment, forming the material layer stack 400 includes formation of a bilayer 401A followed by formation of bilayer 401B on bilayer 401A. In an exemplary embodiment, bilayer 401A includes a sacrificial layer 402A and a layer 404A which includes monocrystalline silicon, on the layer 402A. Bilayer 401B includes a sacrificial layer 402B and a layer 404B which includes monocrystalline silicon on sacrificial layer 402B.

In an embodiment, sacrificial layers 402A and 402B include silicon and germanium such as $Si_{1-x}Ge_x$, where X is between 0.3-0.35. In at embodiment, the sacrificial layers are doped to increase wet etch removal rates relative to silicon. In an exemplary embodiment, sacrificial layer 402A can be grown epitaxially on the substrate 102 to follow the crystal orientation of the substrate 102. In an embodiment, the substrate 102 includes silicon where the silicon substrate has a top surface having a (001) crystal plane.

The layer 404A is formed on sacrificial layer 402A, where layer 404A includes a material of the channel layer 104 or channel layer 106. In an embodiment, the process of forming each bilayer 401A is repeated until a desired number of silicon channel layers are formed within a Si/SiGe superlattice-material layer stack 400.

The thickness of the material layer stack 400 may be limited by an aspect ratio of a fin structure, for example, after patterning of the material layer stack 400. For a given total thickness of the material layer stack 400, individual thickness of sacrificial layers 402A and 402B may be limited by a minimum thickness required of layers 404A and 404B. However, the thickness of sacrificial layers 402A and 402B determine spacing between channels that will be formed in a downstream process. In embodiments, sacrificial layer 402A is grown to a thickness of less than 15 nm. Depending on embodiments, layer 404A has a thickness that is between 5 nm and 15 nm.

In an embodiment, the material layer stack 400 is a Si/SiGe super lattice, where the super lattice material layer stack 400 is formed by a reduced pressure CVD process. It is to be appreciated that the deposition process minimizes $Si_{1-x}Ge_x$, strain relaxation to enable longitudinal strain in transistor channels that are to be subsequently formed.

In the illustrative embodiment, a bilayer 401B is formed on the layer 404A of bilayer 401A. The sacrificial layer 402B is epitaxially formed on layer 404A. The thickness of sacrificial layer 402B may or may not be equal to the thickness of sacrificial layer 402A. In an exemplary embodiment, each of the layers 404A and 404B are substantially the same, i.e., they both include a same material and have a same or substantially the same thickness, as is shown in FIG. 4A. While two bilayers 401A and 401B are shown, the number of bilayers can be between 2-10.

FIG. 4B is a cross sectional illustration of a block 406 formed by patterning the material layer stack 400 (shown in FIG. 4A). In an embodiment, prior to patterning, a mask is formed on layer 404B, where the mask defines a shape and size of block 406. The mask may include a dielectric material. In an embodiment, a plasma etch process may be utilized to pattern and form the block 406. The plasma etch forms channel layers 104 and 106. In exemplary embodiments, the sidewalls 406A and 406B may be substantially vertical as shown. It is to be appreciated that when sidewall profiles 406A are substantially vertical, lateral thickness of each channel layer that will be subsequently be formed may have substantially a same lateral dimension (defined by the space between the sidewall 406A and 406B). The patterning process carried out etches a portion of substrate 102. The etch process is halted after etching a desired amount of substrate 102.

After formation of block 406, a dielectric 408 is formed on the block 406 and on sidewalls of block 406. The dielectric 408 is then polished until a top surface of dielectric 408 is substantially coplanar with a top surface of the mask utilized to form block 406. In an embodiment, a chemical mechanical polish (CMP) process is utilized to planarize the dielectric 408. The dielectric 408 may be then recessed to a level at or below uppermost surface 102A of substrate 102 as shown. In an embodiment, a wet etch process is used to recess dielectric 408.

FIG. 4C is an isometric illustration following the formation of a dummy gate structure 410 formed on a first portion of the block 406. In an embodiment, a dummy gate dielectric layer such as silicon oxide, or $Al_2O_3$, is blanket deposited on block 406 and on dielectric 408 and a sacrificial dummy gate material (herein, dummy gate material) is deposited on the dummy gate dielectric.

In an embodiment, the dummy gate material includes an upper layer that is a mask. A plasma may be utilized, for example, to pattern the dummy gate material into a dummy gate structure 410. In an exemplary embodiment, the plasma etch process is selective to an uppermost surface 408A of the dielectric 408. In an embodiment, dummy gate structure 410 has sidewalls 410A and 410B that are substantially vertical relative to an uppermost dielectric surface 408A. The dummy gate structure 410 has a lateral thickness, $L_G$. $L_G$ defines a thickness of a transistor gate that is to be formed.

Figure 4D:
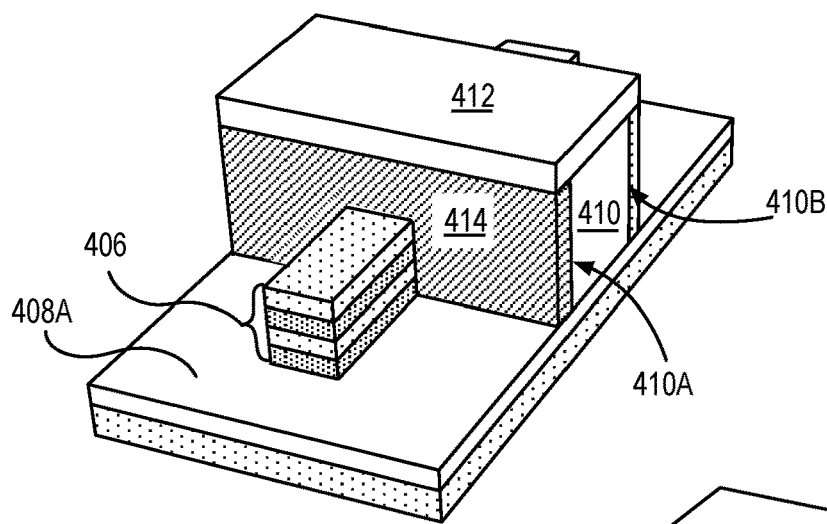
FIG. 4D is an isometric illustration of the structure in FIG. 4C following the formation of a dielectric spacer adjacent to the dummy gate structure.

FIG. 4D is an isometric illustration of the structure in FIG. 4C following the formation of a dielectric spacer 414 adjacent to the dummy gate structure 410. In an embodiment, a dielectric spacer layer is blanket deposited on block 406 and on the dummy gate structure 410 and on sidewalls 410A and 410B. The deposition process utilized may include a PECVD (plasma enhanced chemical vapor deposition), physical vapor deposition (PVD), chemical vapor deposition (CVD) process. In an embodiment, the dielectric spacer layer includes silicon and nitrogen and/or carbon.

In an embodiment, the dielectric spacer layer is planarized. The planarization process may expose an uppermost surface of dummy gate structure 410. As shown, a mask 412 is formed over dummy gate structure 410 and over a portion of the dielectric spacer layer. The dielectric spacer layer is etched to form dielectric spacer 414. A plasma etch may be utilized to pattern the dielectric spacer 414. An over etch of the dielectric spacer layer is carried out to remove the dielectric spacer layer from sidewall portions of block 406 that are not covered by the mask.

In the illustrative embodiment, the dielectric spacer 414 is formed on sidewall portions of the block 406 directly adjacent to the dummy gate structure 410. As shown, the dummy gate structure 410 and the dielectric spacer 414 both cover portions of the sidewalls of block 406.

The dielectric spacer 414 may be formed to a thickness that is determined by downstream process, electrical performance requirements (such as modulation of external resistance) or a combination thereof. In an embodiment, the dielectric spacer 414 has a lateral thickness between 4 nm to 10 nm.

Figure 4E:
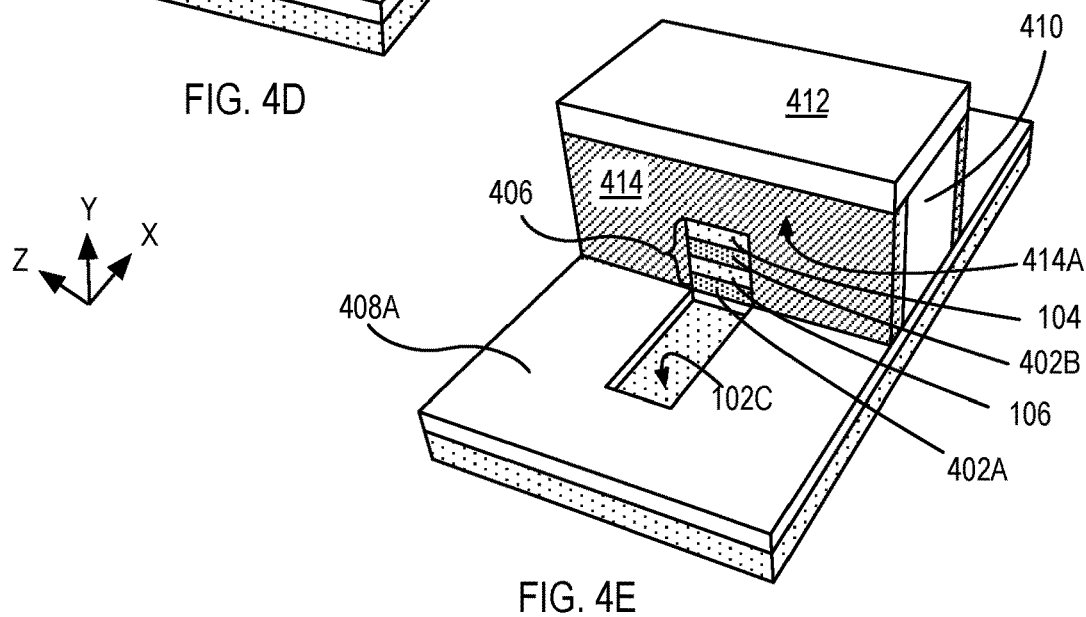
FIG. 4E illustrates the structure of FIG. 4D following process to etch portions of the material layer stack not covered by the spacer or the dummy gate structure.

FIG. 4E illustrates the structure of FIG. 4D following the process to etch portions of the block 406 that are exterior to the dielectric spacer 414. In an embodiment, a plasma etch process is utilized to etch the layers within block 406. In an embodiment, after the plasma etch process etches the lower most layer 402A, an uppermost portion of the substrate 102 is partially etched. In an embodiment, surface 102C is recessed below surface 408A of dielectric 408.

In embodiments, where the layers 402A includes SiGe the plasma etch process may recess portions of the layers 402A and 402B selective to channel layers 104 and 106 under the dielectric spacer 414. In exemplary embodiments, sidewalls of layers 104, 106, 402A and 402B (of the block 406) are substantially coplanar with spacer sidewall 414A. In embodiments where the substrate includes a silicon on insulator, the opening 419 exposes a buried oxide.

Figure 5:
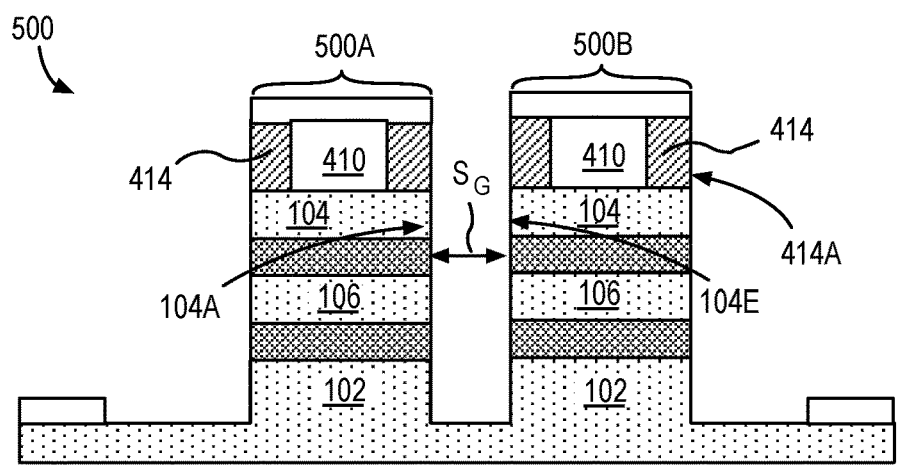
FIG. 5 illustrates a cross-sectional illustration of a plurality of dummy gate structures that are laterally spaced apart.

FIG. 5 is a cross-sectional illustration of a pair of structures 500A and 500B where each structure 500A and 500B includes dielectric spacer 414 adjacent to dummy gate structure 410. In the illustrative embodiment, structures 500A and 500B are laterally separated by a distance, $S_G$. $S_G$ may be defined as a distance between channel sidewall 104A of structures 500A and channel sidewall 104E of structure 500B. Depending on embodiments, $S_G$ is between 8 nm and 25 nm. In an embodiment, $S_G$ is substantially uniform along the y-direction or along a vertical sidewall of structure 500A or 500B. In other embodiments, $S_G$ is tapered to the substrate 102. It is to be appreciated that the $S_G$ is equal to or less than a lateral thickness of a spacer to be formed between channel layers 104 and 106. The spacer growth process to be described herein, has several advantages in that a selective growth process is utilized and that growth process overcomes traditional deposition and etch processes utilized to form spacer when space between structures 500A and 500B approach the dimension of the spacer to be formed.

Two approaches for fabricating transistors 100 and 200 described above in association with FIGS. 1A and 2A, are discussed below.

FIG. 6A illustrates the structure of FIG. 4E following the process to recess portions of the sacrificial layer in material layer stack 400 under dielectric spacer 414. In an embodiment, a plasma etch, wet chemical etch, or a combination thereof is utilized to recess the sacrificial layers in material layer stack 400, from a region directly under and adjacent dielectric spacer 414.

FIG. 6B is a cross-sectional illustration of the structure in FIG. 6A through the line A-A' following the process to recess portions of the sacrificial layer 402A. In the illustrative embodiment, sacrificial layers 402A, 402B are removed from a region directly under the dielectric spacer 414 in the cross-sectional illustration. The boundary between dielectric spacer 414 and dummy gate structure 410 is defined by dashed boundary line 600. Removal of sacrificial layers 402A and 402B forms plurality of recesses 415, as shown. The plurality of recesses 415 expose upper, lower and sidewall surfaces of the channel layer 104 and channel 106, as shown.

In exemplary embodiments, sidewalls 402D of each of the sacrificial layers 402A and 402B are aligned with an inner spacer sidewall 414A of the dielectric spacer 414, as shown. As shown the sidewalls 402D are substantially concaved. It is to be appreciated that the concavity depends on a etch process utilized. In some embodiments, concaved sidewall 402D is under a portion the dielectric spacer 414, as shown in the enhanced cross-sectional illustration of FIG. 6C. In other embodiments, a concaved sidewall 402D is under a portion of the dummy gate structure 410 as shown by dashed lines 601. It is to be appreciated that sidewalls 402D of each of the sacrificial layers 402A and 402B may not all be vertically aligned with each other. Alignment of sidewalls may depend on variations in vertical thickness of each sacrificial layer 402A and 402B, where the vertical thickness is along the y-direction. Variations in the vertical thickness between sacrificial layer 402A and 402B can cause differential recess of sidewalls 402D of each sacrificial layer 402A and 402B. Differential recess can lead to misalignment between sidewalls 402D of each sacrificial layer 402A and 402B.

In some embodiments, the sidewall 402D is substantially vertical, with respect to surface 104C, as shown in the enhanced cross-sectional illustration of FIG. 6D. In some such embodiment, each sacrificial layer 402A and 402B has substantially vertical sidewall 402D.

While the sacrificial layers 402A and 402B are removed in a subsequent downstream operation, the shapes of sidewalls 402A and 402B may influence the shapes of a dielectric spacer that will be formed in the plurality of recesses 415. The shapes of 402A and 402B may also influence profiles/shape of a gate dielectric layer that will be formed directly adjacent to a dielectric spacer in a downstream operation.

Figure 7A:
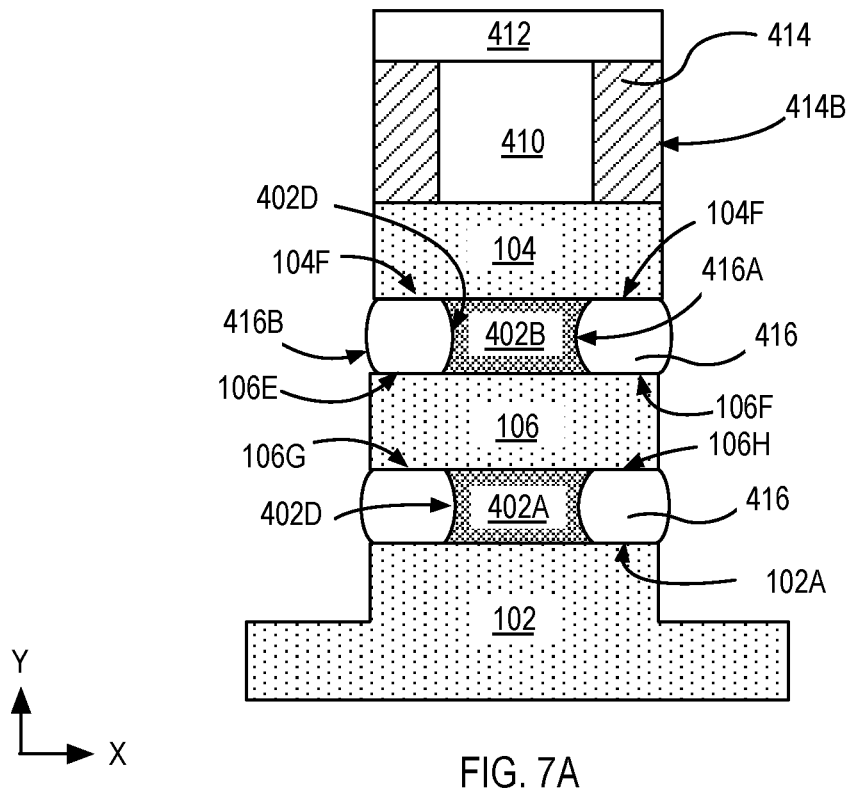
FIG. 7A is an isometric illustration of the structure of FIG. 6B following the process to grow a dielectric spacer.

FIG. 7A illustrates the structure of FIG. 6B, following the formation of spacer 416 adjacent to sacrificial layers 402A and 402B. Formation of spacer 416 utilizes surface termination differential between SiGe in the sacrificial layer 402A and 402B and silicon in the channel layer 104 and 106. Termination differential may be utilized for selective deposition of spacer film in the opening or cavity 415. In an embodiment, a native oxide on Si channel layers 104 and 106, is a primary oxide and includes a Si—OH termination. A passivant may be used in the selective deposition process that binds with Si—OH termination, preventing deposition of spacer film on Si. On the other hand, a native oxide on the sacrificial layer 402A and 402B, is a secondary oxide because of high Ge concentration on the surface of the sacrificial layer 402A and 402B. The secondary oxide does not bind with the passivant used. Thus, selective passivation is performed prior to the growth process. The selective passivation method prevents formation of a spacer material against silicon but promotes formation of spacer material from surfaces of the sacrificial layer 402A and 402B between the channel layer 104 and 106 and between channel layer 106 and substrate 102. In an exemplary embodiment, the spacer 416 includes a material having a low dielectric constant. A dielectric constant between 1-3 may be consider a low dielectric constant material. A low dielectric constant material may be suitable when transistors are operated at sub 1V. In an embodiment, a low dielectric constant spacer 416 includes Si, O and C such as SiOC. In one or more embodiments, spacer 416 includes a material that is the same or substantially the same as the material of the spacer 114.

In an embodiment, a dielectric spacer material is deposited using an atomic layer deposition (ALD), PVD, PECVD or a CVD process. In an embodiment, the spacer 416 is formed to fill the opening 415 and has a convex sidewall formed against concave sidewalls 402D of the sacrificial layer 402A and 402B. In an exemplary embodiment, the growth process also forms outer convex spacer sidewalls 416B, opposite to the sidewall 416A. It is to be appreciated that curvature of sidewalls 416A and 416B may be different. In some embodiments when sidewall 402D of sacrificial layers 402A and 402B are substantially vertical, spacer sidewall 416B is substantially convex.

The growth process forms material of spacer 416 from the sidewall 402D and expands to form spacer 416 adjacent to surfaces 104F of channel layer 104, adjacent to surfaces 106E, 106F, 106G and 106H of channel 106 and adjacent to substrate surface 102A, as shown. The growth process does not reform spacer on the existing dielectric spacer 414.

In some embodiments, spacer sidewall 416B extends beyond exterior spacer sidewall 414B as shown. In the illustrative embodiment, the growth process form convex shaped spacer sidewall 416B. In embodiments where growth process for formation of spacer 416 is prolonged, portions of the spacer 416 are formed adjacent to exterior facing sidewalls of channel layer 104 or 106. It is to be appreciated that spacer 416 does not require shaping via an etch process.

Figure 7B:
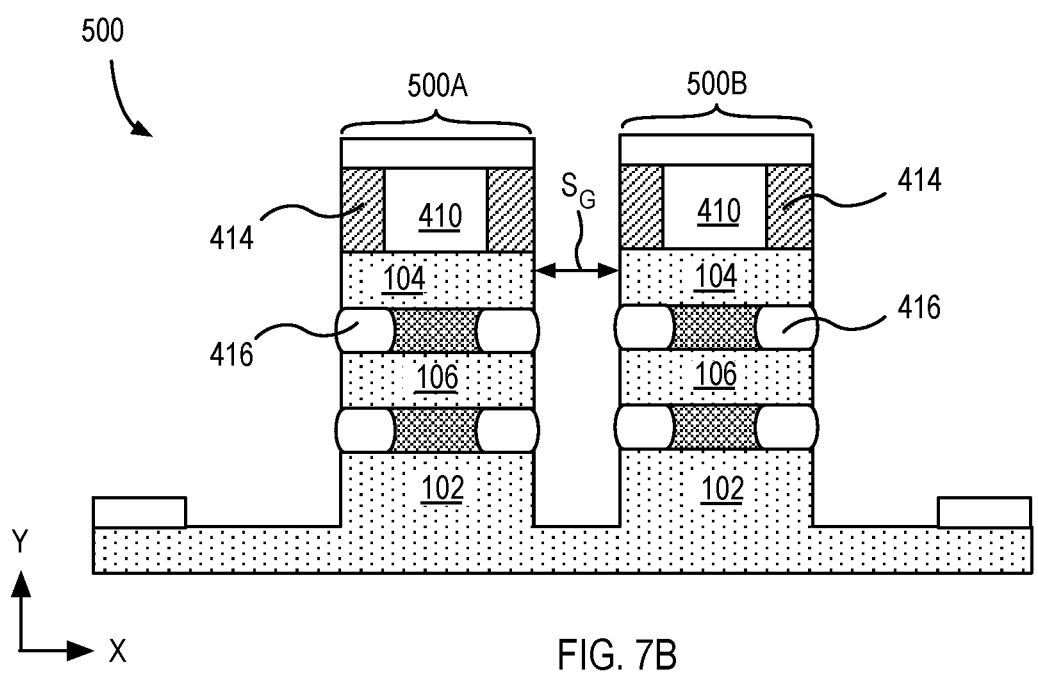
FIG. 7B illustrates a plurality of structures such as structures depicted in FIG. 7B.

FIG. 7B is a cross-sectional illustration of a pair of structures 500A and 500B in FIG. 5 following the process to form spacer 416 described in FIG. 7A. In the illustrative embodiment, spacer 416 have lateral thickness that exceed the distance $S_G$. A selective spacer growth process described above enables formation of spacer such as spacer 416 of arbitrary lateral thickness. Such a process is of increased utility when structures 500A and 500B are separated by a distance comparable to a thickness of a spacer that would be deposited by fill processes.

Figure 8A:
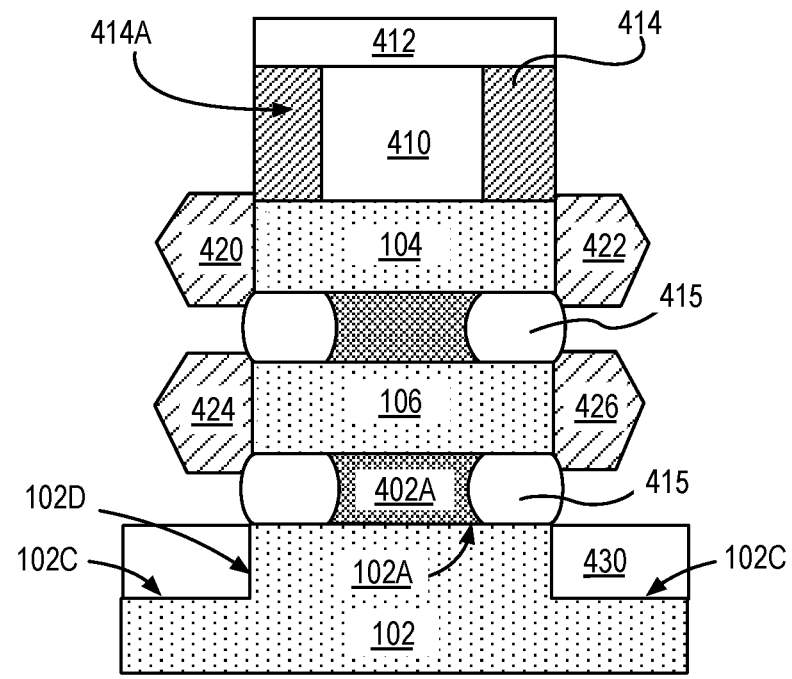
FIG. 8A illustrates the structure of FIG. 7B following the formation of an epitaxial source structure and an epitaxial drain structure.

FIG. 8A illustrates the structure of FIG. 7A following the formation epitaxial structures 420, 422, 424 and 426. In an embodiment, a dielectric 430 is deposited on the surface 102C and sidewall 102D of the substrate 102. The dielectric 430 may be blanket deposited on the structure of FIG. 7A, planarized and then recessed. In an embodiment, mask 412 is removed during the planarization process. In other embodiments, mask 412 is removed at a later operation. In embodiments dielectric has an uppermost surface 430A that is at a level of the uppermost surface 102A or above the surface 102A.

In an embodiment, epitaxial structures 420, 422, 424 and 426 are epitaxially grown by a reduced pressure CVD (RPCVD) process. In an embodiment, epitaxial structures 420, 422, 424 and 426 are grown to have faceted sidewalls, such as is illustrated. In PMOS embodiments, epitaxial structures 420, 422, 424 and 426 include $Si_{1-x}Ge_X$, where X is between 0.3-0.35, and p+ dopants such as boron, gallium, indium, aluminum. In exemplary embodiments, the $Si_{1-x}Ge_X$ epitaxial structures 420, 422, 424 and 426 are grown to have compressive strain. In NMOS embodiments, epitaxial structures 420, 422, 424 and 426 include silicon having a tensile strain, and n-dopants such as phosphorus or arsenic.

In the illustrative embodiment, the epitaxial structures 420, 422, 424 and 426 are formed adjacent to sidewalls of channel layer 104 and channel 106 and adjacent to portions of spacer 416, as shown. As shown, the epitaxial structures 424 and 426 are separated from dielectric surface 430A by spacer 416. In the illustrative embodiment, epitaxial structures 420, 422 are epitaxial source structures 420 and 422, and epitaxial structures 424, 426 are epitaxial drain structures 424 and 426. In other embodiments, where dielectric 430 is not present, epitaxial structure 424 and 426 are in contact with substrate 102.

Figure 8B:
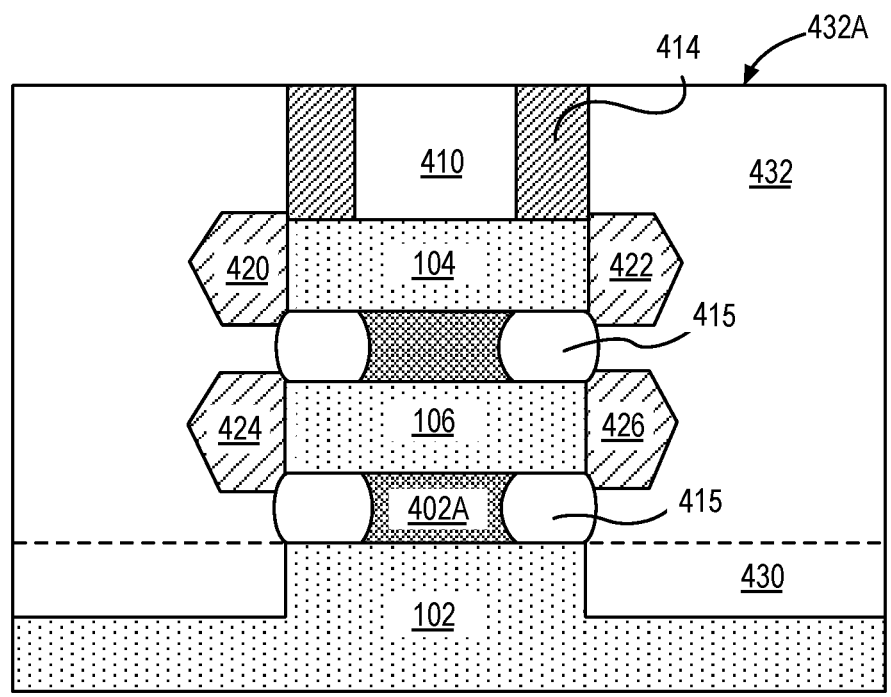
FIG. 8B illustrates the structure of FIG. 8A following the formation of a dielectric on the epitaxial source structure and the epitaxial drain structure and on an isolation region.

FIG. 8B is a cross-sectional illustration of the structure in FIG. 8A following the formation of a dielectric 432. In the illustrative embodiment, the dielectric 432 is formed on the epitaxial structures 420, 422, 424 and 426, on dielectric spacer 414, on mask 412 (not shown), on dielectric surface 430 and on the dielectric surface 408A (not shown). In an embodiment, the dielectric 432 is deposited by a blanket deposition process using a physical vapor deposition (PVD) or a chemical vapor deposition (CVD) process. In an embodiment, a chemical mechanical polish (CMP) process is utilized to planarize the dielectric 432 which forms an uppermost surface 432A that is substantially planar, as shown.

Figure 9A:
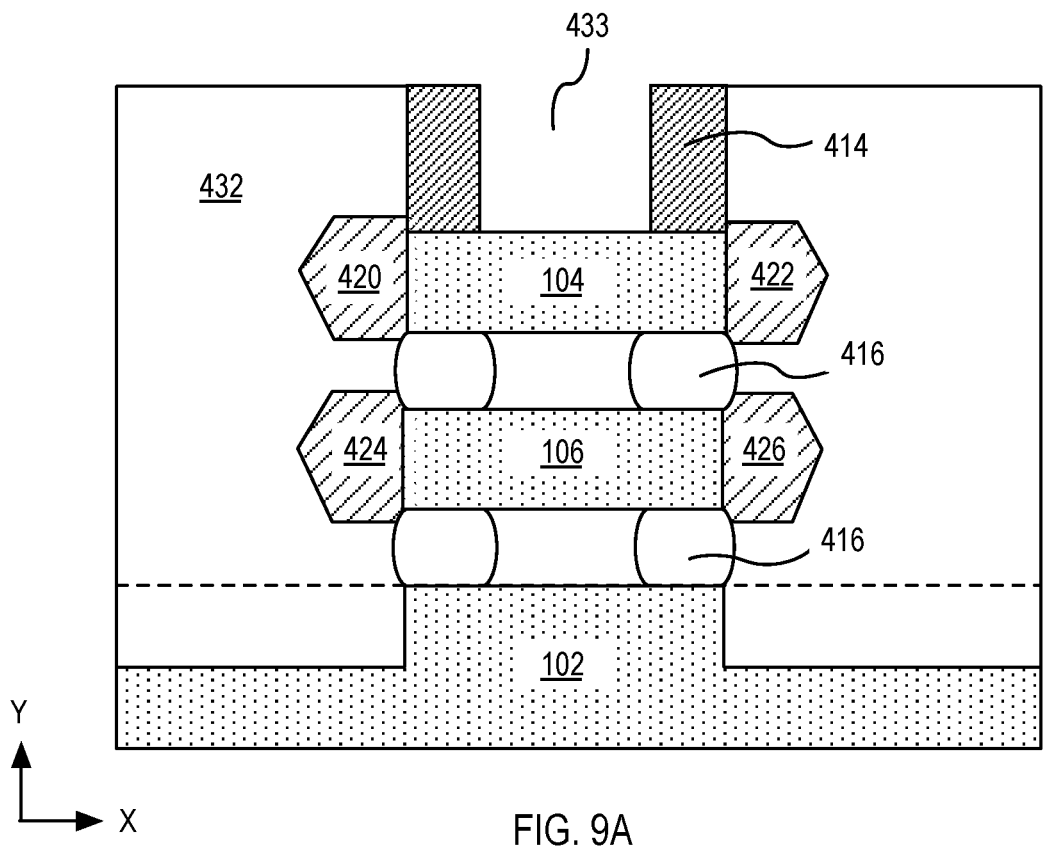
FIG. 9A illustrates the structure of FIG. 8B following the process to remove the dummy gate structure and portions of the sacrificial layer that are exposed after removing the dummy gate structure.

FIG. 9A illustrates the structure of FIG. 8A following the process to remove the dummy gate structure 410 as well as the sacrificial layers 402A and 402B that are exposed after removing the dummy gate structure 410.

In an embodiment, where the dummy gate structure 410 includes a dummy gate material such as polysilicon, silicon germanium, germanium, a combination of plasma etch, and wet chemical etch can be utilized to remove the dummy gate structure 410. Channel layers 104 or 106 are anchored to the dielectric 432 via the epitaxial structures 420, 422, 424 and 426. Removal of the dummy gate structure 410 does not affect channel layers 104 or 106, because of the presence of a dummy gate dielectric between the dummy gate material and adjacent channel layers 104 and 106 (as described in association with FIG. 4C). Removal of the dummy gate structure 410 forms an opening 433 as illustrated.

In an embodiment, a wet chemical process is utilized to remove the sacrificial layers 402A and 402B. The wet etch chemistry may selectively etch sacrificial layers 402A and 402B with respect to a dummy gate dielectric layer on channel layer 104 and 106 as well as selectively with respect to dielectric spacer 414 and spacer 416, and dielectric 432.

Figure 9B:
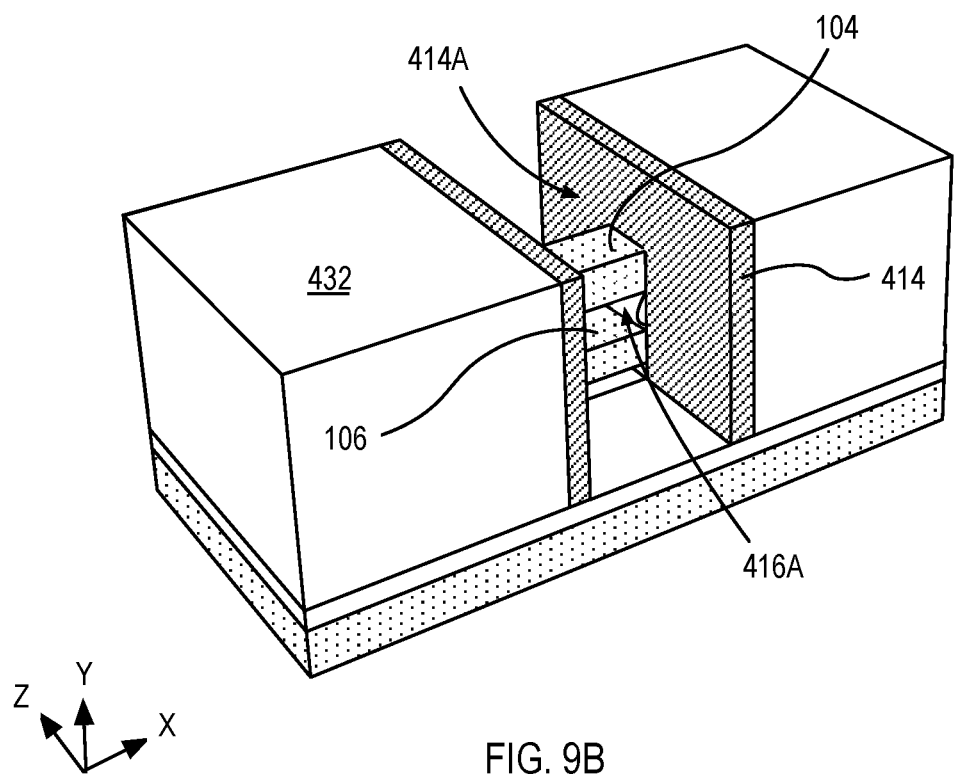
FIG. 9B is an isometric illustration of the structure in FIG. 9A.

FIG. 9B is an isometric illustration of the structure of FIG. 9A illustrating channel layers 104 and 106, that are suspended after removal of sacrificial layers. It is to be appreciated that dummy gate dielectric material (not shown) cladding channel layers 104 and 106 prevent etching of the channel layers 104 and 106. In the illustrative embodiment, a convex spacer sidewall 416A is visible. In some embodiments, sidewall 416A can over grow and laterally extend onto spacer sidewall 414A (as described in association with FIG. 1D).

Figure 10A:
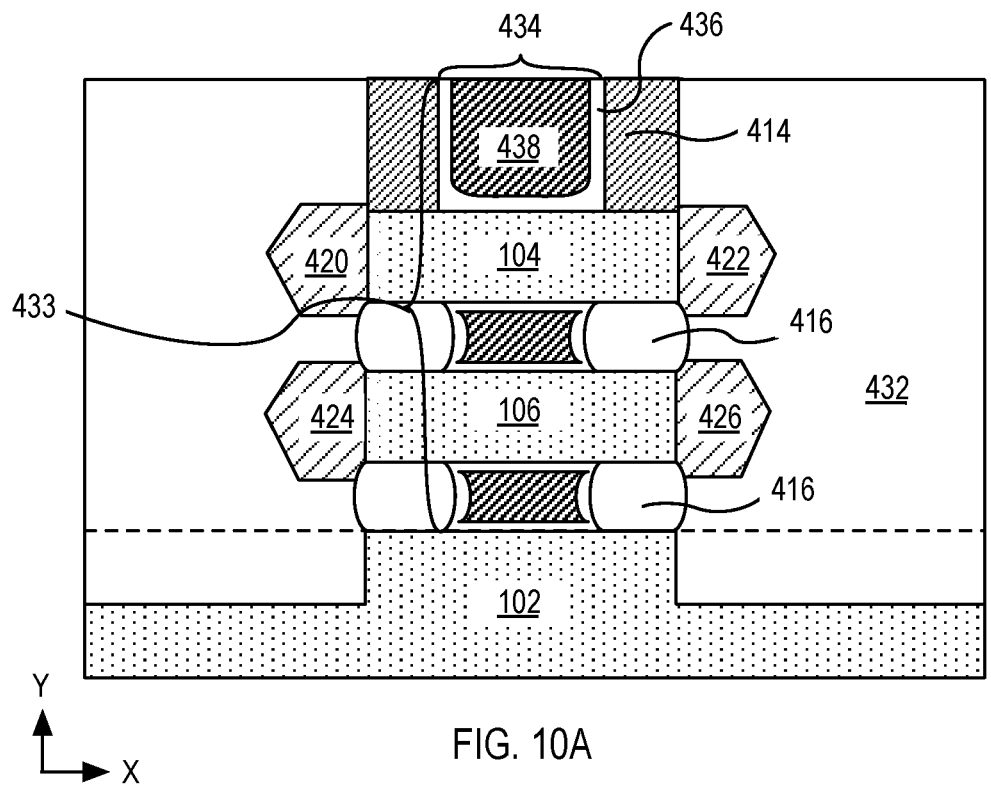
FIG. 10A illustrates the structure of FIG. 9A following the formation of a gate on each of the plurality of nanowires.

FIG. 10A is a cross-sectional illustration of the structure in FIG. 9A following the process to form gate structure 434. In an embodiment, a gate dielectric layer 436 is deposited by an ALD process. An ALD process facilitates coverage of gate dielectric layer 436 on surfaces that are not in a vertical line of sight. As shown, gate dielectric layer 436 may be blanket deposited on all exposed surfaces within the opening 433. In the illustrative embodiment, the gate dielectric layer 436 is formed on sidewalls of dielectric spacer 414 and spacer 416, and on an uppermost surface 432A of dielectric 432.

In an embodiment, a gate electrode material is deposited into the opening 433 on the gate dielectric layer 436 and on the gate dielectric layer 436 above the dielectric surface 426A.

In the illustrative embodiment, the gate electrode material is deposited by an ALD process to fill in regions between the channel layers 104 and 106 and between channel 106 and surface 102A. In exemplary embodiments, the gate electrode material deposited between channel layer 104 and 106 has a thickness that is less than 10 nm but at least 2 nm. In some examples gate electrode mater may be pinched off due to a small vertical spatial separation (such as less than less than 10 nm) between channel layers 104 and 106.

After deposition process, the gate electrode material is planarized, such as, by a CMP process, for example. The CMP process removes the gate dielectric layer 436 and excess gate electrode material from above the dielectric surface 432A to form gate electrode 438.

Thus, formation of gate electrode 438 completes fabrication of an analog transistor that has one or more features of the transistors 200 such as recessed channels and dual gate dielectric layers.

Figure 10B:
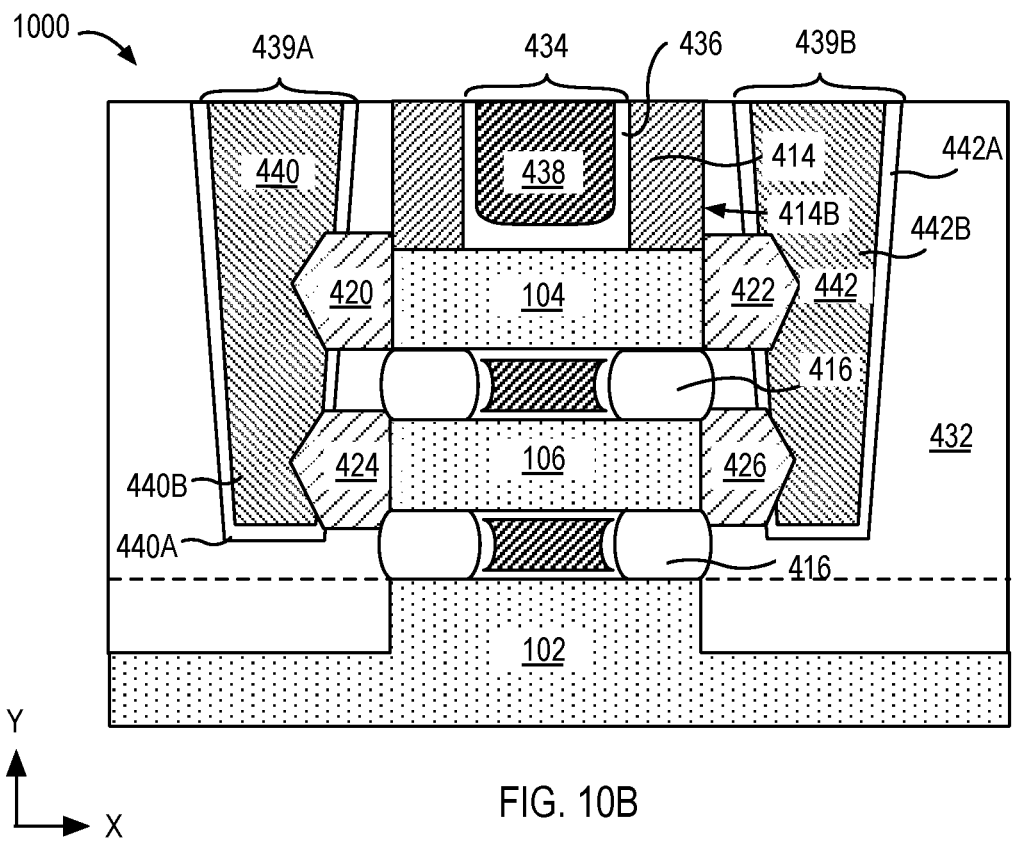
FIG. 10B illustrates the structure of FIG. 10A following the formation of a source contact on the epitaxial source structure and a drain contact on the epitaxial drain structure.

After formation of gate electrode 438, a source contact 440 and a drain contact 442 may be formed on the source epitaxial structure 420, drain epitaxial structure 422, as is shown in FIG. 10B.

Openings 439A and 439B may be formed in the dielectric 432 to form source and drain contacts. In the illustrative embodiment, an opening 439A is formed to expose epitaxial structures 420 and 424, and an opening 439B is formed to expose epitaxial structures 422 and 426. In an embodiment, a plasma etch process is utilized to form openings 439A and 439B after the formation of a mask on the dielectric 432, on the dielectric spacer 414, on the gate dielectric layer 436 and on the gate electrode 438. In an embodiment, the openings 439A and 439B can extend to spacer sidewalls 414A. In an embodiment, the dielectric 432 is etched by a plasma etch process to form openings 439A and 439B. In an embodiment, the plasma etch is isotropic and removes the dielectric 432 between channel layers 104 and 106, as shown.

In an embodiment, one or more layers of contact material are blanket deposited on exposed surfaces of the epitaxial structures 420, 422, 424 and 426, on uppermost surface of the dielectric 432, dielectric spacer 414, gate dielectric layer 436, gate electrode 438. In an embodiment, the contact material includes one or more materials. In the illustrative embodiment, a barrier material 440A is deposited into opening 439A and a fill metal 440B is deposited into the opening 439A on the barrier layer 440A. Also as shown, a barrier layer 442A is deposited into opening 439B and a fill metal 442B is deposited into the opening 439B on the barrier layer 442A.

In some examples, the barrier layers 440A and 442A includes a material such as tantalum nitride or ruthenium. In some examples, the fill metal 440A and 442A include a material such as cobalt, ruthenium, copper, molybdenum or tungsten. In an embodiment, a planarization process is utilized to remove the excess one or more layers of contact material formed on uppermost surface of the dielectric 432, dielectric spacer 414, gate dielectric layer 436 and gate electrode 438. The planarization process forms source contact 440 and drain contact 442.

It is to be appreciated that N-MOS or P-MOS type nanowire transistors may be co-fabricated on the same substrate and share one or more processing operations. In an embodiment, epitaxial source and drain structures may be formed prior to forming spacers between channel layers.

Figures 11A, 11B:
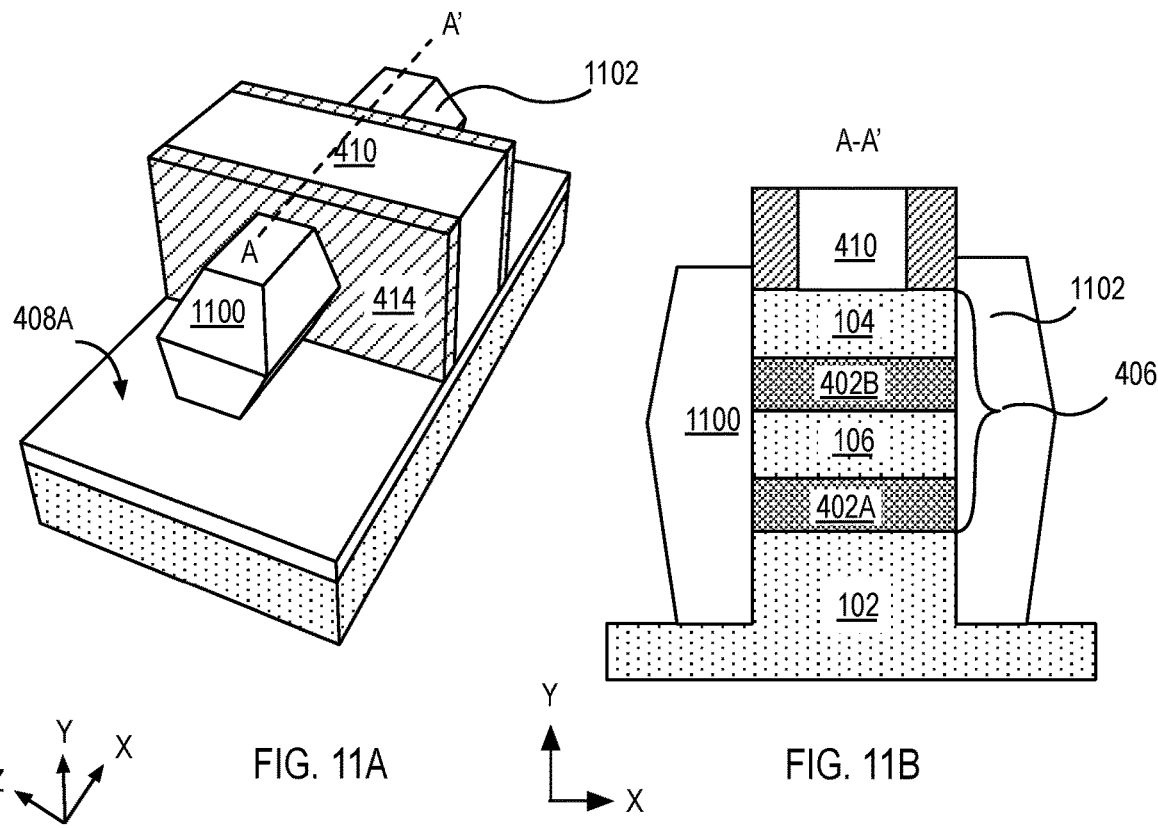
FIG. 11A is an isometric illustration of the structure in FIG. 4E following the formation of an epitaxial source structure and an epitaxial drain structure adjacent to exposed portions of the block.
FIG. 11B is a cross-sectional illustration of the structure of FIG. 11A through a line A-A'.

FIG. 11A illustrates the structure of FIG. 4E following the formation of epaxial structures adjacent to exposed sidewalls of block (hidden). In an embodiment, epitaxial structures 1100 and 1102 include a material and are formed by a method utilized to form epitaxial source structure 420 and 422, respectively. As shown epitaxial structures 1100 and 1102 have multiple facets that are a result of templated growth from the material in block 406.

FIG. 11B is a cross-sectional illustration of the structure in FIG. 11A, through a line A-A'. In the illustrative embodiment, the epitaxial structures 1100 and 1102 are formed on sidewalls the block 406. In the illustrative embodiment, the block 406 has substantially vertical sidewalls and the interface between epitaxial structures 1100 and 1102 and the sacrificial layers 402A and 402B are substantially planar.

In an embodiment, the epitaxial structures 1100 and 1102 are epitaxially grown by a reduced pressure CVD (RPCVD) process. In an embodiment, the structures 1100 and 1102, are grown to have faceted sidewalls, such as is illustrated. In PMOS embodiments, the source and drain epitaxial structures include $Si_{1-x}Ge_X$, where X is between 0.3-0.35, and $p^+$ dopants such as boron, gallium, indium, aluminum. In exemplary embodiments, the $Si_{1-x}Ge_X$ structures 1100 and 1102 are grown to have compressive strain.

In the illustrative embodiment, the epitaxial structures 1100 and 1102 are also epitaxially grown on the substrate 102.

Figures 12A, 12B:
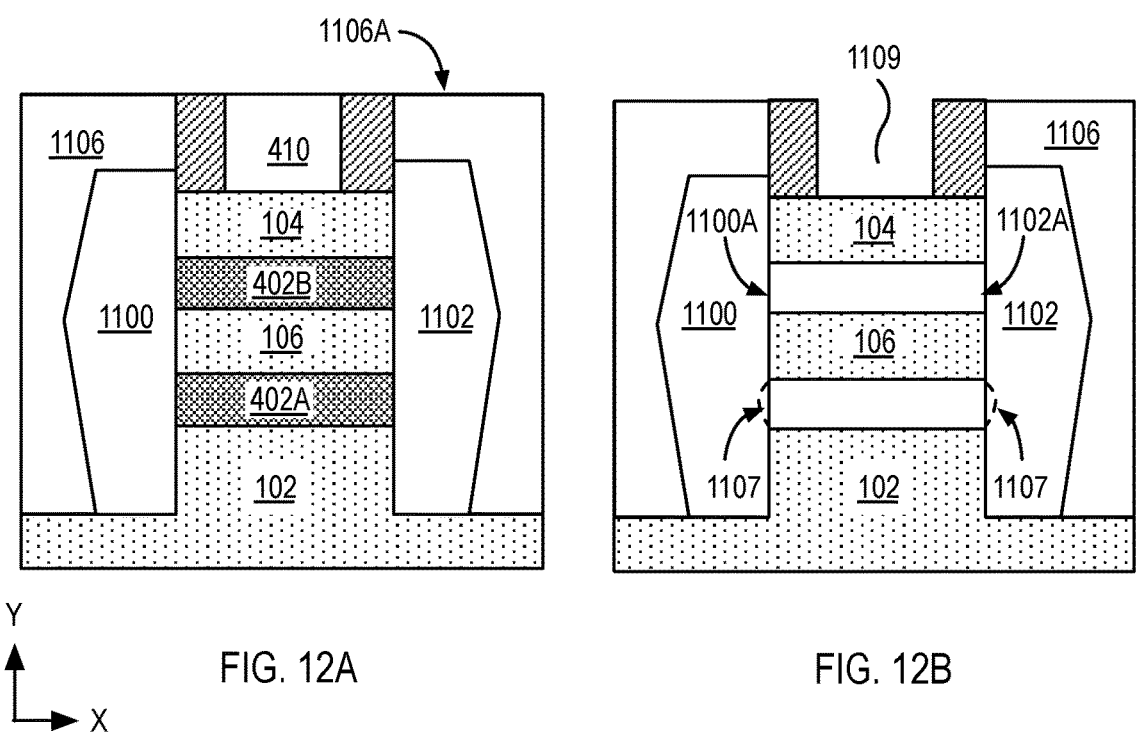
FIG. 12A illustrates the structure of FIG. 11B following the formation of a dielectric on the epitaxial source structure and the epitaxial drain structure and on an isolation region.
FIG. 12B illustrates the structure of FIG. 12A following the process to remove the sacrificial layer adjacent to the layer of monocrystalline silicon in the plurality of bilayers.

FIG. 12A illustrates the structure of FIG. 11B following the formation of a dielectric 1106. In the illustrative embodiment, the dielectric 1106 is formed on the epitaxial structures 1100 and 1102, on dielectric spacer 414, on mask 412 (not shown), on dielectric surface 1106 and on the dielectric surface 408A (not shown). In an embodiment, the dielectric 1106 is deposited by a blanket deposition process using a physical vapor deposition (PVD) or a chemical vapor deposition (CVD) process. In an embodiment, a chemical mechanical polish (CMP) process is utilized to planarize the dielectric 1106 which forms an uppermost surface 1106A that is substantially planar, as shown.

FIG. 12B illustrates the structure of FIG. 12A following the process to remove the dummy gate structure 410 and the sacrificial layers 402A and 402B exposed after removing the dummy gate structure 410. In an embodiment, the process to remove dummy gate structure 410 and sacrificial layers 402A and 402B is the same or substantially the same as the method described above in association with FIG. 9A. The process of removing dummy gate structure 410 and the sacrificial layers 402A and 402B forms an opening 1109.

In the illustrative embodiment, a removal process, for example a wet etch process, removes sacrificial layers 402A and 402B from between channel layer 104 and 106. As shown, portions of sidewalls 1100A and 1102A between channel layer 104 and 106, and between channel layer 106 and substrate 102 are substantially planar. In some embodiments, chemical etchants that remove sacrificial layers 402A and 402B can form recesses (indicated by dashed lines 1107) in portions of the sidewall 1100A and 1102A. In the illustrative embodiment, the recesses are concaved within the epitaxial structures 1100 and 1102.

Figure 12C:
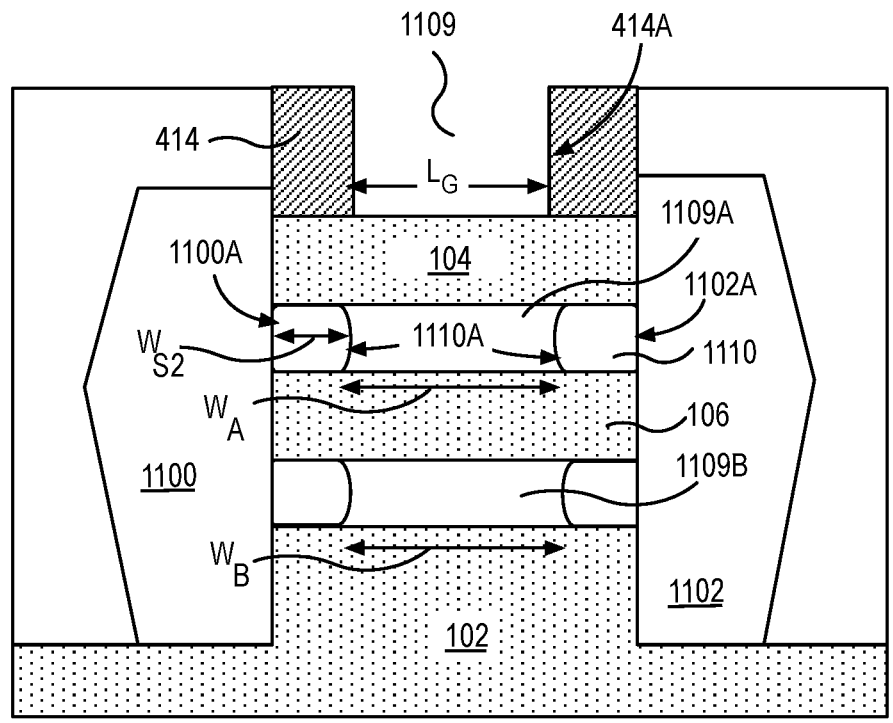
FIG. 12C is an isometric illustration of the structure of FIG. 12B following the process to grow a dielectric spacer adjacent to epitaxial drain structure and epitaxial source structure.

FIG. 12C is a cross-sectional illustration of the structure in FIG. 12B following the formation of spacer 1110 in the opening 1109, between channel layer 104 and 106 and adjacent to epitaxial structures 1100 and 1102. In an exemplary embodiment, epitaxial structures 1100 and 1102 include Si and Ge. In some such embodiments, spacer 1110 may be formed by a process described in association with FIG. 7A.

Formation of spacer 1110 utilizes surface termination differential between SiGe in the epitaxial source structure 1100 and epitaxial drain structure 1110 and Si in the channel layer 104 and 106 and substrate 102. Termination differential may be utilized for selective deposition of spacer film in the opening or cavity 1109A and 1109B, between channel layer 104 and channel layer 106, and between 106 and substrate 102, respectively. In an embodiment, a native oxide on Si channel layers 104 and 106 and substrate 102, is a primary oxide and includes a Si—OH termination. A passivant may be used in the selective deposition process that binds with Si—OH termination, preventing deposition of spacer film on Si. On the other hand, a native oxide, on the epitaxial source structure 1100 and epitaxial drain structure 1110, is a secondary oxide because of high Ge concentration on the surface of the epitaxial source structure 1100 and epitaxial drain structure 1110. The secondary oxide does not bind with the passivant used. Thus, selective passivation is performed prior to the growth process. The selective passivation method prevents formation of a spacer material against silicon but promotes formation of spacer material from inner surfaces of the epitaxial source structure 1100 and epitaxial drain structure 1110.

In an exemplary embodiment, spacer 1110 is formed adjacent to sidewalls 1100A and 1102A. As shown, the spacer growth process forms convex sidewalls 1110A away from epitaxial sidewalls 1100A and 1102A. The spacer growth process may be timed to control lateral growth of spacer 1110. In an exemplary embodiment, the spacer growth process controls a lateral thickness, $W_{S2}$, of spacer 1110. The spacer growth process in opening 1109A reduces lateral thickness of opening 1109A between the channel layer 104 and 106, and epitaxial sidewalls 1100A and 1102A. The spacer growth process in opening 1109B reduces lateral thickness of opening 1109B between the channel layer 106 and substrate 102, and epitaxial sidewalls 1100A and 1102A.

As shown, after formation of spacer 1110, openings 1109A and 1109B each have a lateral thickness, $W_A$ and $W_B$ respectively, along a length of the channel layer 104. Spacer 1110 may also be referred to as an inner spacer 1110 because it is formed after formation of epitaxial structures 1100 and 1102.

The removed portion of dummy gate structure above the channel layer 104 determines a gate length, $L_G$. It is desirable for transistor functionality for openings 1109A and 1109B to have lateral thickness, $W_A$ and $W_B$, respectively, that are the same or substantially the same as $L_G$. it is to be appreciated that convex sidewalls 1100A do not alter transistor performance.

Figure 13:
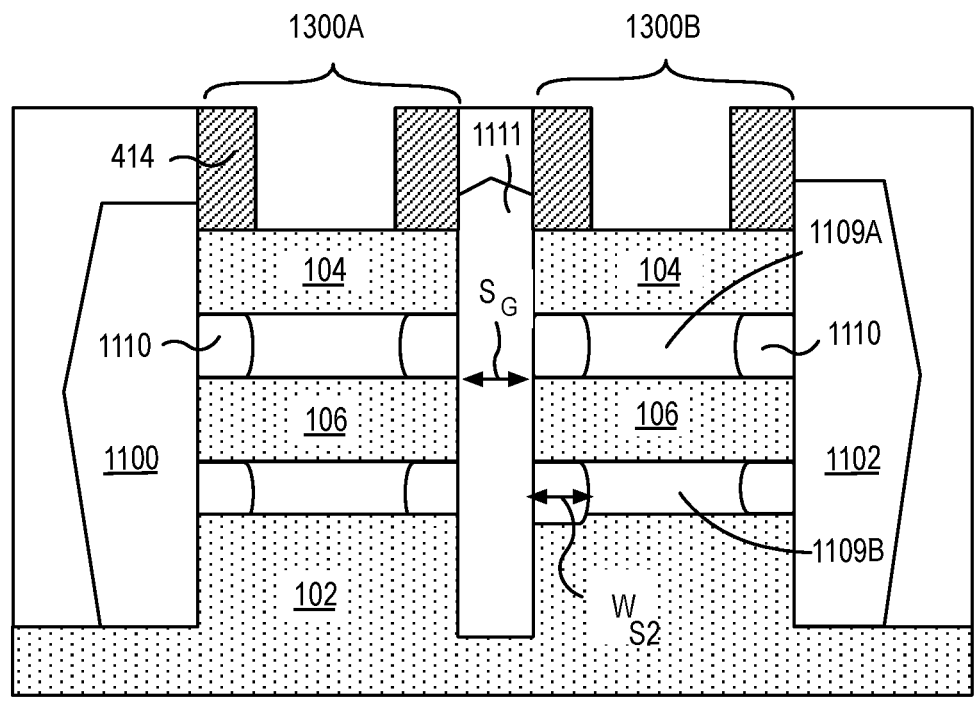
FIG. 13 illustrates a plurality of structures such as structures depicted in FIG. 12C.

FIG. 13 is a cross-sectional illustration of a pair of structures 1300A and 1300B in FIG. 5 following the process to form spacer 1110. In the illustrative embodiment, structures 1300A and 1300B are laterally separated by a distance, $S_G$. $S_G$ may be equal to or less than a lateral thickness, $W_{S2}$, of spacer 1110. In the illustrative embodiment, spacers 1110 have lateral thickness, $W_{S2}$, that is comparable to a distance $S_G$.

A selective spacer growth process described above enables formation of spacer 1110 having an arbitrary lateral thickness, $W_{S2}$, to be formed after formation of a shared epitaxial structure 1111 and epitaxial structures 1100 and 1102. Shared epitaxial structure 1111 may extend continuously between the channel layer 104 and channel layer 106 and extend to the substrate 102. Epitaxial structure 1111 may have a sufficiently large enough volume to provide uniaxial strain to channel layers 104 and 106 in structures 1300A and 1300B. In the illustrative embodiment, epitaxial structure 1100 is an epitaxial source structure 1100 and shared epitaxial structure 1111 is an epitaxial drain structure 1111 for structure 1300A. In one such embodiment, shared epitaxial structure 1111 is a epitaxial drain structure 1111, and epitaxial structure 1102 is an epitaxial source structure 1102 for structure 1300B.

A process to form spacer 1110 after formation of epitaxial structures 1100, 1102 and 1111 is advantageous when structures 1300A and 1300B are separated by a distance, $S_G$, that is between 1-2 times a thickness of a spacer that would be deposited in the opening 1109A by fill processes. A conformal deposit and fill process requires $S_G$ to be greater than two times a thickness, $W_{S2}$ of an as deposited spacer to prevent merging of spacer seams. The selective growth process described herein, enables formation of spacers having an arbitrary lateral thickness within nanowire gate all around transistors. A selective growth process also enables formation of a shared epitaxial structure that can improve strain in two or more channel layers as well as enable formation of transistors to be spaced apart by a distance that is less than two times a spacer thickness.

Figure 14:
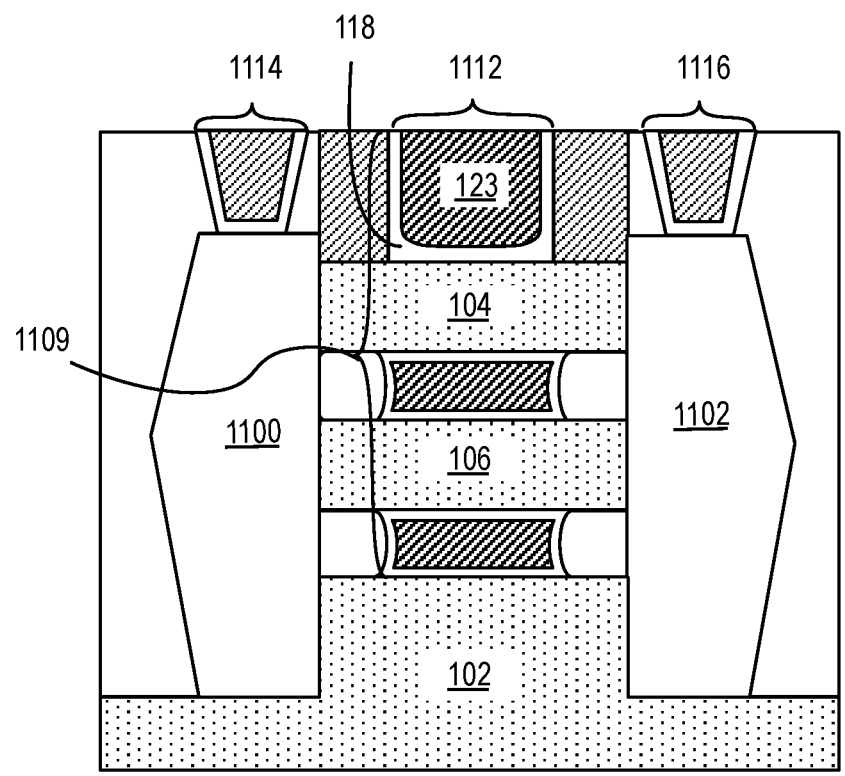
FIG. 14 illustrates the structure of FIG. 12B following the formation of a gate on each of the plurality of nanowires and following the formation of a source contact on the raised source structure and a drain contact on the raised drain structure.

FIG. 14 illustrates the structure of FIG. 12C following the formation of a gate structure 1112 in opening 1109 and formation of source contact 1114 and a drain contact 1116. In an embodiment, the process of formation of gate structure 1112 the same and substantially the same as the process of forming gate structure 434. In exemplary embodiments, gate structure 1112 includes a gate electrode 123 and gate dielectric layer 118. In an embodiment, the process to form source contact 1114 and a drain contact 1116 is the same or substantially the same as the process of forming source contact 440 and a drain contact 442. In the illustrative embodiment, source contact 440 and a drain contact 442 are formed above the epitaxial structures 1100 and 1102. In other embodiments, source contact 440 and a drain contact 442 are formed above and on sidewalls of epitaxial structures 1100 and 1102.

FIG. 15A illustrates a cross-sectional view of a system 1500 including a nanowire transistor with convex sidewall spacer, such as the transistor 1000 described in association with FIG. 10B and a non-volatile memory element 1502 coupled to a contact of the transistor 1000. In the illustrative embodiment, the non-volatile memory element 1502 is coupled to the drain contact 442 of the transistor 1000.

Non-volatile memory element 1502 may include a magnetic tunnel junction (MTJ) device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then feature size scaling of MTJ devices can be relaxed. In an embodiment, transistor 1000, which can provide an additional current boost (through increase in drive current), can be advantageously coupled to non-volatile memory element 1502 such as an MTJ device to overcome any larger critical switching current requirements.

FIG. 15B illustrates a cross-sectional view of an example non-volatile memory element 1502 that includes a magnetic tunnel junction (MTJ) material device. In the illustrated embodiment, the MTJ device includes a bottom electrode 1504, a fixed magnet 1506 above the bottom electrode 1504, a tunnel barrier 1508 on the fixed magnet 1506, a free magnet 1510 on the tunnel barrier 1508, and a top electrode 1512 on the free magnet 1510. In an embodiment, a dielectric spacer laterally surrounds (not shown) non-volatile memory element 1502.

In an embodiment, fixed magnet 1506 includes a material and has a thickness sufficient for maintaining a fixed magnetization. For example, fixed magnet 1506 may include an alloy such as CoFe and CoFeB. In an embodiment, fixed magnet 1506 includes $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, fixed magnet 1506 is FeB, where the concentration of boron is between 10 and 40 atomic percent of the total composition of the FeB alloy. In an embodiment, the fixed magnet 1506 has a thickness that is between 1 nm and 2.5 nm.

In an embodiment, tunnel barrier 1508 is composed of a material suitable for allowing electron current having a majority spin to pass through tunnel barrier 1508, while impeding, at least to some extent, electron current having a minority spin from passing through tunnel barrier 1508. Thus, tunnel barrier 1508 (or spin filter layer) may also be referred to as a tunneling layer for electron current of a particular spin orientation. In an embodiment, tunnel barrier 1508 includes a material such as, but not limited to, magnesium oxide (MgO) or aluminum oxide ($Al_2O_{15}$). In an embodiment, tunnel barrier 1508 including MgO has a crystal orientation that is (001) and is lattice matched to free magnet 1510 above tunnel barrier 1508 and fixed magnet 1506 below tunnel barrier 1508. In an embodiment, tunnel barrier 1508 is MgO and has a thickness is between 1 nm to 2 nm.

In an embodiment, free magnet 1510 includes a magnetic material such as Co, Ni, Fe or alloys of these materials. In an embodiment, free magnet 1510 includes a magnetic material such as FeB, CoFe and CoFeB. In an embodiment, free magnet 1510 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 1510 is FeB, where the concentration of boron is between 10 and 40 atomic percent of the total composition of the FeB alloy. In an embodiment, free magnet 1510 has a thickness that is between 1 nm and 2.0 nm.

In an embodiment, bottom electrode 1504 includes an amorphous conductive layer. In an embodiment, bottom electrode 1504 is a topographically smooth electrode. In an embodiment, bottom electrode 1504 includes a material such as W, Ta, TaN or TiN. In an embodiment, bottom electrode 1504 is composed of Ru layers interleaved with Ta layers. In an embodiment, bottom electrode 1504 has a thickness between 20 nm and 50 nm. In an embodiment, top electrode 1512 includes a material such as W, Ta, TaN or TiN. In an embodiment, top electrode 1512 has a thickness between 30 nm and 70 nm. In an embodiment, bottom electrode 1504 and top electrode 1512 are the same metal such as Ta or TiN. In an embodiment, the MTJ device has a combined total thickness of the individual layers is between 60 nm and 100 nm and a thickness is between 10 nm and 50 nm.

Referring again to FIG. 15A, in an embodiment, non-volatile memory element 1502 is a resistive random access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 1000, that can provide an additional current boost (through increase in drive current), can be advantageously coupled to an RRAM device to provide reliable switching operation.

FIG. 15C illustrates a cross-sectional view of an example non-volatile memory element 1502 that includes a resistive random-access memory (RRAM) device. In the illustrated embodiment, the RRAM material stack includes a bottom electrode 1514, a switching layer 1516 over the bottom electrode 1514, an oxygen exchange layer 1518 over the switching layer 1516, and a top electrode 1520 on the oxygen exchange layer 1518.

In an embodiment, bottom electrode 1514 includes an amorphous conductive layer. In an embodiment, bottom electrode 1514 is a topographically smooth electrode. In an embodiment, bottom electrode 1514 includes a material such as W, Ta, TaN or TiN. In an embodiment, bottom electrode 1514 is composed of Ru layers interleaved with Ta layers. In an embodiment, bottom electrode 1514 has a thickness is between 20 nm and 50 nm. In an embodiment, top electrode 1520 includes a material such as W, Ta, TaN or TiN. In an embodiment, top electrode 1520 has a thickness is between 15 nm and 70 nm. In an embodiment, bottom electrode 1514 and top electrode 1520 are the same metal such as Ta or TiN.

Switching layer 1516 may be a metal oxide, for example, including oxygen and atoms of one or more metals, such as, but not limited to Hf, Zr, Ti, Ta or W. In the case of titanium or hafnium, or tantalum with an oxidation state +4, switching layer 1516 has a chemical composition, $MO_X$, where O is oxygen and X is or is substantially close to 2. In the case of tantalum with an oxidation state +5, switching layer 1516 has a chemical composition, $M_2O_X$, where O is oxygen and X is or is substantially close to 5. In an embodiment, switching layer 1516 has a thickness is between 1 nm and 5 nm.

Oxygen exchange layer 1518 acts as a source of oxygen vacancy or as a sink for $O^{2-}$. In an embodiment, oxygen exchange layer 1518 is composed of a metal such as but not limited to, hafnium, tantalum or titanium. In an embodiment, oxygen exchange layer 1518 has a thickness is between 5 nm and 20 nm. In an embodiment, the thickness of oxygen exchange layer 1518 is at least twice the thickness of switching layer 1516. In another embodiment, the thickness of oxygen exchange layer 1518 is at least twice the thickness of switching layer 1516. In an embodiment, the RRAM device has a combined total thickness of the individual layers is between 60 nm and 100 nm and thickness is between 10 nm and 50 nm.

Referring again to FIG. 15A, the memory device 1502 is coupled to the transistor 1000 through interconnect structures at a level 1522 above the transistor. In an embodiment, level 1522 includes a single level of interconnects coupled with the transistor 1100. In other embodiments, level 1522 includes a plurality of sublevels of interconnect routing structures.

In the illustrative embodiment, the system 1500 includes a drain interconnect 1524 between the memory device 1502 and the drain contact 442. As shown, the drain interconnect 1524 is on and coupled with the drain contact 442. The system 1500 further includes a source interconnect 1526 coupled with the source contact 440 and gate interconnect 1528 coupled with the gate structure 434. In other embodiments, a gate contact is between the gate structure 434 and the gate interconnect 1528. The memory device 1502 is further coupled to a memory interconnect 1530.

In an embodiment, source interconnect 1526, gate interconnect 1528 and drain interconnect 1524 are embedded in a dielectric layer 1532. In an embodiment, the source interconnect 1526, gate interconnect 1528, drain interconnect 1524 and memory interconnect 1530 each include titanium, tantalum, tungsten, ruthenium, copper, or nitrides of titanium, tantalum, tungsten, ruthenium. In other embodiments the source interconnect 1526, gate interconnect 1528, drain interconnect 1524 and memory interconnect 1530, include a liner layer including ruthenium or tantalum and a fill metal such as copper or tungsten. In the illustrative embodiment, the memory device 1502 and the memory interconnect 1530 are embedded in a dielectric 1534.

In an embodiment, the level 1522 further includes a barrier dielectric layer 1536 between the dielectric 1532 and dielectric 1534. In embodiments dielectric 1532 and 1534 include silicon and one or more of nitrogen, oxygen and carbon such as, silicon nitride, silicon dioxide, carbon doped silicon nitride, silicon oxynitride or silicon carbide.

In embodiments, barrier dielectric layer 1536 includes silicon and one or more of nitrogen and carbon such as, silicon nitride, carbon doped silicon nitride or silicon carbide.

Figure 16:
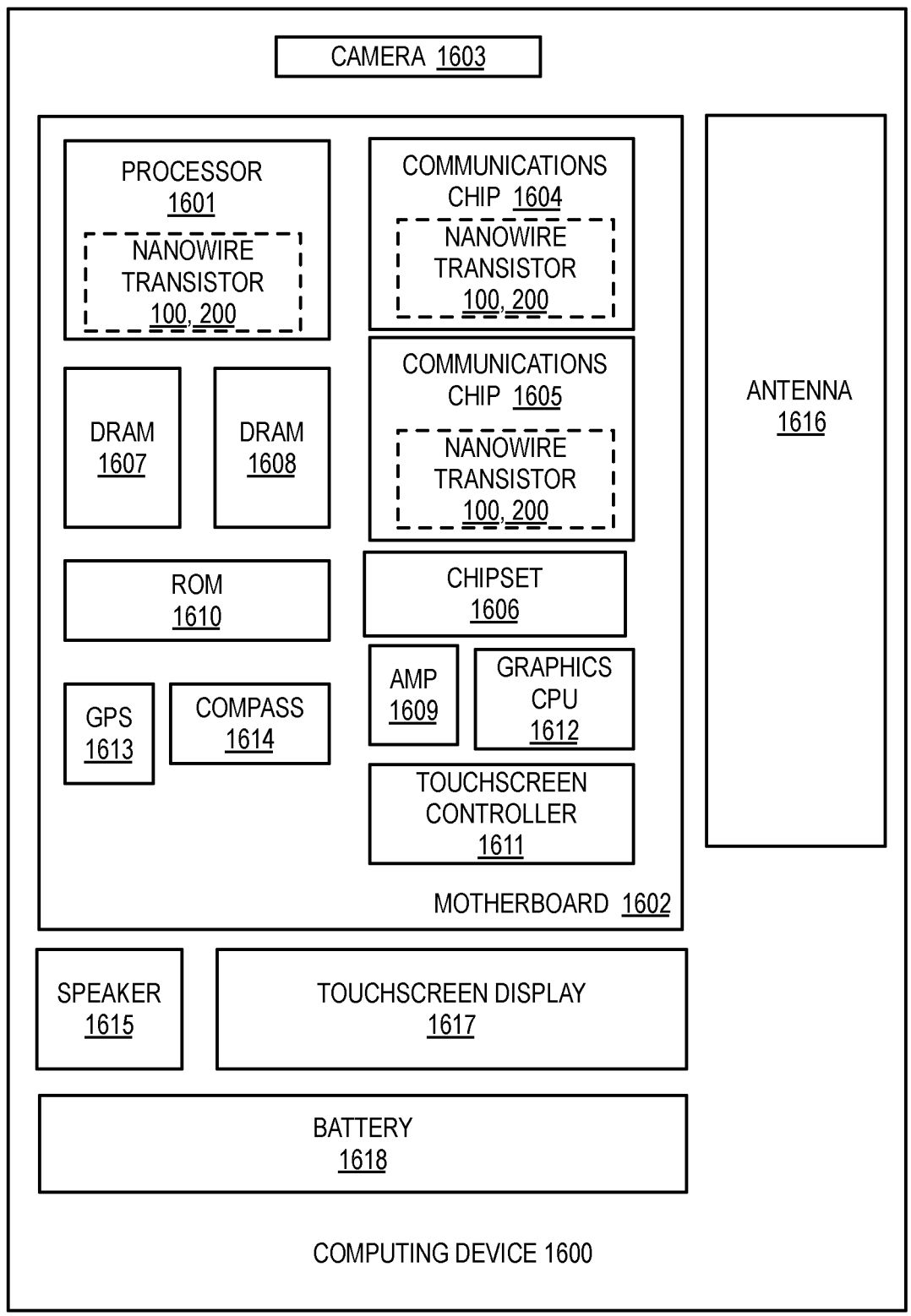
FIG. 16 illustrates a computing device in accordance with embodiments of the present disclosure.

FIG. 16 illustrates a computing device 1600 in accordance with embodiments of the present disclosure. As shown, computing device 1600 houses a motherboard 1602. Motherboard 1602 may include a number of components, including but not limited to a processor 1601 and at least one communications chip 1604 or 1605. Processor 1601 is physically and electrically coupled to the motherboard 1602. In some implementations, communications chip 1605 is also physically and electrically coupled to motherboard 1602. In further implementations, communications chip 1605 is part of processor 1601.

Depending on its applications, computing device 1600 may include other components that may or may not be physically and electrically coupled to motherboard 1602. These other components include, but are not limited to, volatile memory (e.g., DRAM), non-volatile memory (e.g., ROM), flash memory, a graphics processor, a digital signal processor, a crypto processor, a chipset 1606, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1605 enables wireless communications for the transfer of data to and from computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1605 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1600 may include a plurality of communications chips 1604 and 1605. For instance, a first communications chip 1605 may be dedicated to shorter range wireless communications such as Wi-Fi and Bluetooth and a second communications chip 1604 may be dedicated to longer range wireless communications such as GPS, EDGE, GPRS, CDMA, WiMAX, LTE, Ev-DO, and others.

Processor 1601 of the computing device 1600 includes an integrated circuit die packaged within processor 1601. In some embodiments, the integrated circuit die of processor 1601 includes one or more interconnect structures, non-volatile memory devices, and transistors such as nanowire transistors 100 or 200 described in association with FIGS. 1A, 2A respectively. Referring again to FIG. 16, the term "processor" may refer to any device or portion of a device that processes electronic data from registers and/or memory to transform that electronic data into other electronic data that may be stored in registers and/or memory.

Communications chip 1605 also includes an integrated circuit die packaged within communication chip 1605. In another embodiment, the integrated circuit die of communications chips 1604, 1605 includes one or more interconnect structures, non-volatile memory devices, capacitors and transistors such as nanowire transistors 100 or 200 described in association with FIGS. 1A, 2A, respectively. Referring again to FIG. 16, depending on its applications, computing device 1600 may include other components that may or may not be physically and electrically coupled to motherboard 1602. These other components may include, but are not limited to, volatile memory (e.g., DRAM) 1607, 1608, non-volatile memory (e.g., ROM) 1610, a graphics CPU 1612, flash memory, global positioning system (GPS) device 1613, compass 1614, a chipset 1606, an antenna 1616, a power amplifier 1609, a touchscreen controller 1611, a touchscreen display 1617, a speaker 1615, a camera 1603, and a battery 1618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1600 and discussed above may contain a stand-alone integrated circuit memory die that includes one or more arrays of NVM devices.

In various implementations, the computing device 1600 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1600 may be any other electronic device that processes data.

Figure 17:
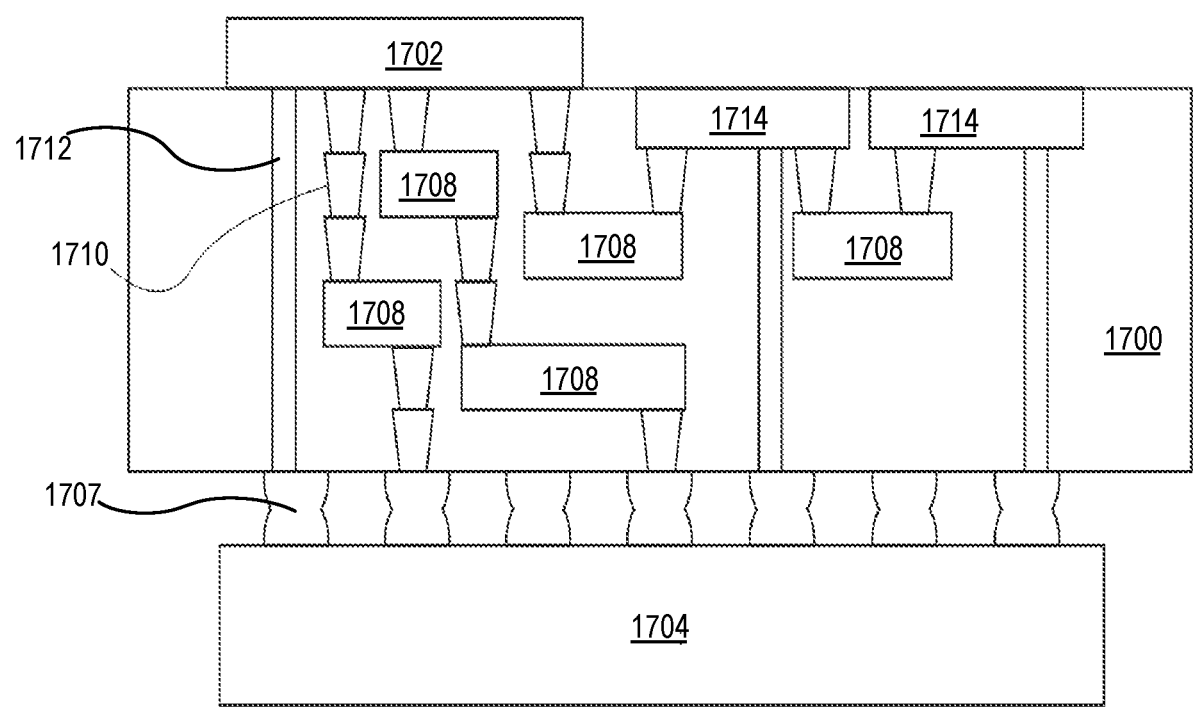
FIG. 17 illustrates an integrated circuit (IC) structure that includes one or more embodiments of the present disclosure.

FIG. 17 illustrates an integrated circuit (IC) structure 1700 that includes one or more embodiments of the disclosure. The integrated circuit (IC) structure 1700 is an intervening substrate used to bridge a first substrate 1702 to a second substrate 1704. The first substrate 1702 may be, for instance, an integrated circuit die. The second substrate 1704 may be, for instance, a memory module, a computer mother, or another integrated circuit die. Generally, the purpose of an integrated circuit (IC) structure 1700 is to spread a connection to a wider pitch or to reroute a connection to a different connection. For example, an integrated circuit (IC) structure 1700 may couple an integrated circuit die to a ball grid array (BGA) 1707 that can subsequently be coupled to the second substrate 1704. In some embodiments, the first substrate 1702 and the second substrate 1704 are attached to opposing sides of the integrated circuit (IC) structure 1700. In other embodiments, the first substrate 1702 and the second substrate 1704 are attached to the same side of the integrated circuit (IC) structure 1700. And in further embodiments, three or more substrates are interconnected by way of the integrated circuit (IC) structure 1700.

The integrated circuit (IC) structure 1700 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1708 and vias 1710, including but not limited to through-silicon vias (TSVs) 1712. The integrated circuit (IC) structure 1700 may further include embedded devices 1714, including both passive and active devices. Such embedded devices 1714 include capacitors, decoupling capacitors, resistors, inductors, fuses, diodes, transformers, device structure including transistors, such as transistors 100 or 200 described in association with FIG. 1A or 2A respectively. Referring again to FIG. 17, the integrated circuit (IC) structure 1700 may further include embedded devices 1714 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 1700.

Thus, one or more embodiments of the present disclosure relate to transistors such as transistors 100, or 200 as described above. The transistors 100, 200 may be used in various integrated circuit applications.

In a first example, a transistor includes a first channel layer over a second channel layer, where the first and the second channel layers include monocrystalline silicon. An epitaxial source structure is coupled to a first end of the first and second channel layers. An epitaxial drain structure is coupled to a second end of the first and second channel layers and a gate is between the epitaxial source structure and the epitaxial drain structure, where the gate is above the first channel layer and between the first channel layer and the second channel layer. The transistor further includes a first spacer including a first material with at least one convex sidewall, where the first spacer is between the gate and each of the epitaxial source structure and the epitaxial drain structure, and where the first spacer is further between the first channel layer and the second channel layer. A second spacer including a second material is above the first channel layer, where the first spacer is between the gate and each of the epitaxial source structure and epitaxial drain structure.

In second examples, for any of first examples, the transistor is in an array of transistors, where the transistor is a first transistor in the array of transistors, where the array of transistors includes a substantially identical second transistor including a third channel layer, a fourth channel layer above the third channel layer, and a third spacer between the third channel layer and the fourth channel layer, the third spacer including and an outer convex sidewall, where the outer convex sidewall of the third spacer is laterally distant from an outer convex sidewall of the first spacer by a distance that is less than two times a lateral thickness of the first spacer, the lateral thickness defined along a length of the first channel layer.

In third examples, for any of the first through second examples, the epitaxial drain structure of the first transistor and an epitaxial source structure of the second transistor are merged.

In fourth examples, for any of the first through third examples, the first spacer includes silicon, oxygen and carbon, where the carbon to oxygen ratio is between 3:1-10:1.

In fifth examples, for any of the first through fourth examples, the second spacer comprises silicon, carbon, oxygen and nitrogen, wherein an atomic percent of carbon is between 3-5 percent, an atomic percent of oxygen is between 25-40 percent, and an atomic percent of nitrogen is between 10-20 percent.

In sixth examples, for any of the first examples, the convex sidewall is adjacent to the epitaxial source structure or epitaxial drain structure, and wherein the first spacer comprises a substantially vertical sidewall relative to a lowermost first spacer surface, wherein the substantially vertical sidewall is adjacent to the gate and opposite to the convex sidewall.

In seventh examples, for any of the first examples, the first spacer includes a first convex sidewall adjacent to the gate and a second convex sidewall adjacent to the source and the drain structure.

In eighth examples, for any of the first through seventh examples, the second convex sidewall is within a body of the source or the drain structure.

In ninth examples, for any of the first through eighth examples, the first spacer includes a first lateral thickness along a length of the first or the second channel layer, and where the second spacer includes a second lateral thickness along the length of the first or the second channel layer, and where the first lateral thickness is between 9 nm and 15 nm and the second lateral thickness is between 9 nm and 12 nm.

In tenth examples, for any of the first through eighth examples, the epitaxial source structure extends from the first end of the first channel layer to the second channel layer, and where the epitaxial drain structure extends from the second end of the first channel layer to the second channel layer and where the epitaxial source structure and epitaxial drain structure includes Si and Ge, and where the convex sidewall is adjacent to the gate structure.

In eleventh examples, for any of the first through tenth examples, the epitaxial source structure and epitaxial drain structure include Si.

In twelfth examples, for any of the first examples, the first spacer includes a convex sidewall adjacent to the gate dielectric and a substantially vertical sidewall relative to a lowermost first spacer surface, where the substantially vertical sidewall is adjacent to the epitaxial source structure or epitaxial drain structure.

In thirteenth examples, for any of the first and thirteenth examples, the first spacer includes a substantially vertical sidewall relative to a lowermost first spacer surface, where the substantially vertical sidewall is adjacent to the epitaxial source structure or epitaxial drain structure.

In a fourteenth example, for any of the first through thirteenth examples, the gate includes a gate dielectric layer and a gate electrode adjacent to the gate dielectric layer, where the gate dielectric layer is between the gate electrode and the first and second channel layers, where the gate dielectric layer is between gate electrode and the first spacer and where the gate dielectric layer is between the gate electrode and the epitaxial source structure and the epitaxial drain structure.

In fifteenth examples, a method of fabricating a transistor, the method includes forming a material layer stack including a plurality of bilayers, where each bilayer is formed by depositing a channel layer on a layer of sacrificial material, patterning the material layer stack into a block, forming a dummy gate over a first portion of the block and forming a first spacer adjacent to the dummy gate and adjacent to the block. The method further includes etching portions of the block adjacent to the first spacer, forming an epitaxial source structure adjacent to a first end of the block and an epitaxial drain structure adjacent to a second end of the block and etching and removing the dummy gate. The method further includes removing the sacrificial material from the block to form a first suspended channel over a second suspended channel and growing a second spacer between the first suspended channel and the second suspended channel, where the growth process forms the second spacer with at least one convex sidewall. The method further includes forming a gate structure between the first suspended channel and the second suspended channel.

In sixteenth examples, for any of the fifteenth through fifteenth examples, where forming the second spacer includes selectively growing the second spacer, in a region between the first suspended channel and the second suspended channel, from a surface of the epitaxial source structure and from a surface of the epitaxial drain structure after completely removing the sacrificial material.

In seventeenth examples, for any of the fourteenth through sixteenth examples, forming the epitaxial source structure and the epitaxial drain structure includes epitaxially growing a material including silicon, germanium and a boron dopant species, where the material forms continuously adjacent to and between a first channel layer in a first plurality of bilayers to a second channel layer in a second plurality of bilayers.

In eighteenth examples, for any of the fifteenth example, forming the second spacer includes selectively recessing the sacrificial material under the first spacer and growing the second spacer from a surface of recessed sacrificial material prior to formation of the epitaxial drain structure and epitaxial drain structure.

In nineteenth examples, a system includes a transistor including a first channel layer over a second channel layer, where the first and the second channel layers include monocrystalline silicon. An epitaxial source structure is coupled to a first end of the first and second channel layers. An epitaxial drain structure is coupled to a second end of the first and second channel layers and a gate is between the epitaxial source structure and the epitaxial drain structure, where the gate is above the first channel layer and between the first channel layer and the second channel layer. The transistor further includes a first spacer including a first material with at least one convex sidewall, where the first spacer is between the gate and each of the epitaxial source structure and the epitaxial drain structure, and where the first spacer is further between the first channel layer and the second channel layer. A second spacer including a second material is above the first channel layer, where the first spacer is between the gate and each of the epitaxial source structure and epitaxial drain structure. The system further includes a non-volatile memory element coupled with the epitaxial drain structure or epitaxial source structure.

In twentieth example, for any of the nineteenth examples, the memory element includes a resistive random-access memory (RRAM) device or a magnetic tunnel junction device, where the RRAM comprises a bottom electrode, a switching layer above the bottom electrode and a top electrode above the switching layer, and where the MTJ device includes a fixed magnet, a tunnel barrier above the fixed magnet and a free magnet above the tunnel barrier.

What is claimed is:

1. An apparatus, comprising:
   a transistor structure of a first conductivity type, comprising:
      a first channel layer over a second channel layer, wherein the first and the second channel layers comprise monocrystalline silicon;
      an epitaxial source structure coupled to a first end of the first and second channel layers;
      an epitaxial drain structure coupled to a second end of the first and second channel layers;
      a gate between the epitaxial source structure and the epitaxial drain structure, the gate above the first channel layer and between the first and the second channel layers;
      a first spacer dielectric material between the gate and each of the epitaxial source structure and the epitaxial drain structure and between the first and the second channel layers, wherein the first spacer dielectric material has a convex sidewall adjacent to the gate and a vertical sidewall adjacent to the epitaxial source and drain structures; and
   a transistor structure of a second conductivity type, comprising:
      a third channel layer over a fourth channel layer; and
      a second spacer dielectric material between the third channel layer and the fourth channel layer, wherein the second spacer dielectric material has a convex sidewall adjacent to a second epitaxial source structure and adjacent to a second epitaxial drain structure that are coupled with the third channel layer.

2. The apparatus of claim 1, wherein the first conductivity type is p-type and the second conductivity type is n-type.

3. The apparatus of claim 2, further comprising a third epitaxial drain structure and a third epitaxial source structure in direct contact with the fourth channel layer and wherein the second transistor structure comprises a metal in contact with the second epitaxial source and drain structures and in contact with the third epitaxial source and drain structures.

4. The apparatus of claim 1, wherein the first spacer dielectric material comprises silicon, oxygen and carbon, wherein the carbon to oxygen ratio is between 1:3-10:1.

5. The apparatus of claim 1, further comprising a third spacer dielectric material above the first channel layer and above the third channel layer, wherein the third spacer dielectric material comprises silicon, carbon, oxygen and nitrogen, wherein an atomic percent of carbon is between 3-5 percent, an atomic percent of oxygen is between 25-40 percent, and an atomic percent of nitrogen is between 10-20 percent.

6. The apparatus of claim 1, wherein the second spacer dielectric material has a convex sidewall adjacent to a second gate.

7. The apparatus of claim 1, wherein the first spacer dielectric material has a first lateral thickness along a length of the first or the second channel layer, and wherein the second spacer dielectric material has the first lateral thickness along the length of the third or the fourth channel layer, and wherein the first lateral thickness is between 9 nm and 15 nm.

8. The apparatus of claim 1, wherein each of the second epitaxial source structure and second epitaxial drain structure comprises silicon and carbon.

9. The apparatus of claim 1, wherein the epitaxial source structure and epitaxial drain structure comprises Si and Ge.

10. The apparatus of claim 1, wherein the gate comprises a gate dielectric layer and a gate electrode adjacent to the gate dielectric layer, wherein the gate dielectric layer is between the gate electrode and the first and second channel layers, wherein the gate dielectric layer is between the gate electrode and the first spacer dielectric material and wherein the gate dielectric layer is between the gate electrode and the epitaxial source structure and the epitaxial drain structure.

11. A system comprising:
   a PMOS transistor structure, comprising:
      a first channel layer over a second channel layer;
      a first epitaxial source structure coupled to a first end of both the first and second channel layers;
      a first epitaxial drain structure coupled to a second end of both the first and second channel layers;
      a first gate between the first and the second channel layers;
      a first spacer dielectric material adjacent to the first gate and between the first and the second channel layers, wherein the first spacer dielectric material has a convex sidewall adjacent to the first gate and a vertical sidewall adjacent to the first epitaxial source and drain structures;
   an NMOS transistor structure, comprising:
      a third channel layer over a fourth channel layer;
      a pair of second epitaxial source structures, a first of the second epitaxial source structures coupled to a first end of the third channel layer and a second of the second epitaxial source structures coupled to a second end of the third channel layer;
      a pair of second epitaxial drain structures, a first of the second epitaxial drain structures coupled to a first end of the fourth channel layer and a second of the second epitaxial drain structures coupled to a second end of the fourth channel layer;
      a second gate between the third and fourth channel layers;
      and
      a second spacer dielectric material adjacent to the second gate and between the third and fourth channel layers, wherein the second spacer has a convex sidewall adjacent to each of the pair of second epitaxial source structures and adjacent to each of the pair of second epitaxial drain structures; and
   a non-volatile memory element coupled with any of the first or second epitaxial drain structures or any of the first or second epitaxial source structures.

12. The system of claim 11, wherein the non-volatile memory element comprises a resistive random-access memory (RRAM) device or a magnetic tunnel junction (MTJ) device, wherein the RRAM comprises a bottom electrode, a switching layer above the bottom electrode and a top electrode above the switching layer, and wherein the MTJ device comprises a fixed magnet, a tunnel barrier above the fixed magnet and a free magnet above the tunnel barrier.

13. The system of claim 11, wherein the first spacer dielectric material comprises silicon, oxygen and carbon, wherein the carbon to oxygen ratio is between 1:3-10:1.

14. The system of claim 13, wherein the first epitaxial source and drain structures comprise Si and Ge.

15. The system of claim 14, wherein the pair of second epitaxial source and drain structures comprise silicon and carbon.

* * * * *